United States Patent
Shimizu et al.

(10) Patent No.: US 7,705,400 B2
(45) Date of Patent: Apr. 27, 2010

(54) SEMICONDUCTOR DEVICE USING FILLED TETRAHEDRAL SEMICONDUCTOR

(75) Inventors: Tatsuo Shimizu, Tokyo (JP); Kazushige Yamamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 293 days.

(21) Appl. No.: 11/837,932

(22) Filed: Aug. 13, 2007

(65) Prior Publication Data
US 2008/0061369 A1 Mar. 13, 2008

(30) Foreign Application Priority Data

Sep. 8, 2006 (JP) ............................ 2006-244459

(51) Int. Cl.
H01L 27/01 (2006.01)
H01L 27/12 (2006.01)
H01L 31/0392 (2006.01)

(52) U.S. Cl. ................. 257/347; 257/365; 257/412; 438/290; 438/301

(58) Field of Classification Search ........... 257/347, 257/365, 412, E29.287, E31.127; 438/290, 438/301, 311
See application file for complete search history.

(56) References Cited

U.S. PATENT DOCUMENTS

| | | | | |
|---|---|---|---|---|
| 7,468,538 B2 * | 12/2008 | Cheng et al. | ............... | 257/347 |
| 2007/0145394 A1 * | 6/2007 | Shimizu et al. | ............... | 257/98 |
| 2007/0152234 A1 | 7/2007 | Yamamoto et al. | | |
| 2007/0267711 A1 | 11/2007 | Yamamoto et al. | | |
| 2008/0035995 A1 * | 2/2008 | Morimoto et al. | ........... | 257/347 |
| 2008/0079022 A1 | 4/2008 | Yamamoto et al. | | |
| 2009/0008653 A1 | 1/2009 | Yamamoto et al. | | |
| 2009/0245314 A1 | 10/2009 | Yamamoto et al. | | |

FOREIGN PATENT DOCUMENTS

| | | |
|---|---|---|
| JP | 4-206774 | 7/1992 |
| JP | 9-252117 | 9/1997 |
| JP | 11-111637 | 4/1999 |
| JP | 2001-160594 | 6/2001 |

OTHER PUBLICATIONS

H. W. A. M. Rompa, et al., "Physical Review Letters", The American Physical Society, vol. 52, No. 8, Feb. 20, 1984, pp. 675-678.
Takahiro Shinada, et al., "Enhancing semiconductor device performance using ordered dopant arrays", Letters, Nature, vol. 437, doi:10.1038/nature04086, Oct. 2005, pp. 1128-1131.

* cited by examiner

*Primary Examiner*—Phuc T Dang
(74) *Attorney, Agent, or Firm*—Oblon, Spivak, McClelland, Maier & Neustadt, L.L.P.

(57) ABSTRACT

A semiconductor device provided with a filled tetrahedral semiconductor is formed by introducing impurity atoms S for substituting the component atoms of sites of lattice points and impurity atoms I to be inserted into interstitial sites of a host semiconductor where component atoms are bonded to form a tetrahedral bonding structure. Such a semiconductor device is made to show a high mobility level and a high current drive force as a semiconductor substance where impurity atoms S are made to have a valance electron agreeing with that of the component atoms of the host semiconductor as a result of charge transfer between impurity atoms S and impurity atoms I and impurity atoms I are bonded in a state of showing an electronic arrangement of a closed shell structure is used as channel material.

9 Claims, 12 Drawing Sheets

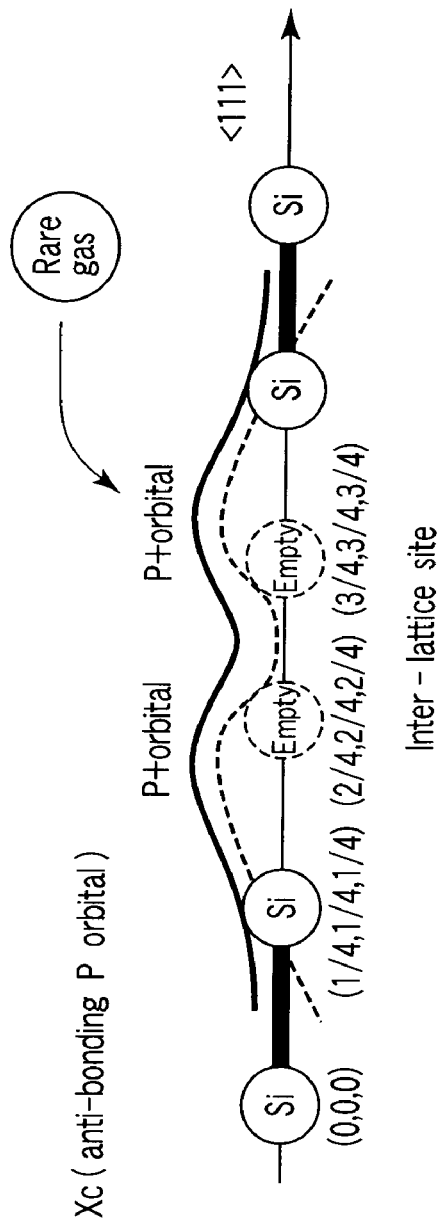
F I G. 1A
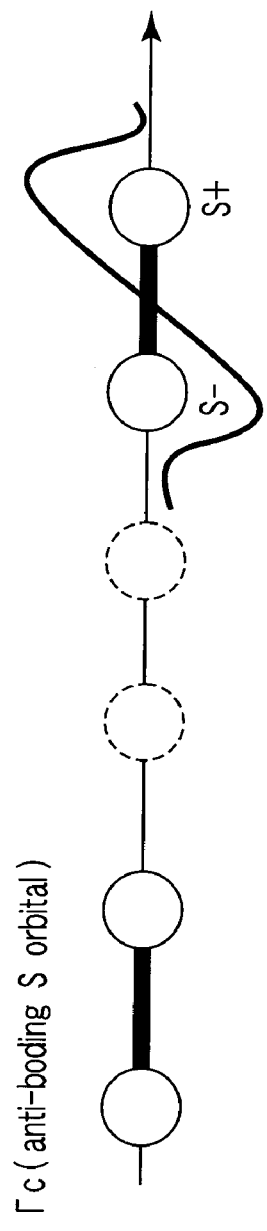
F I G. 1B
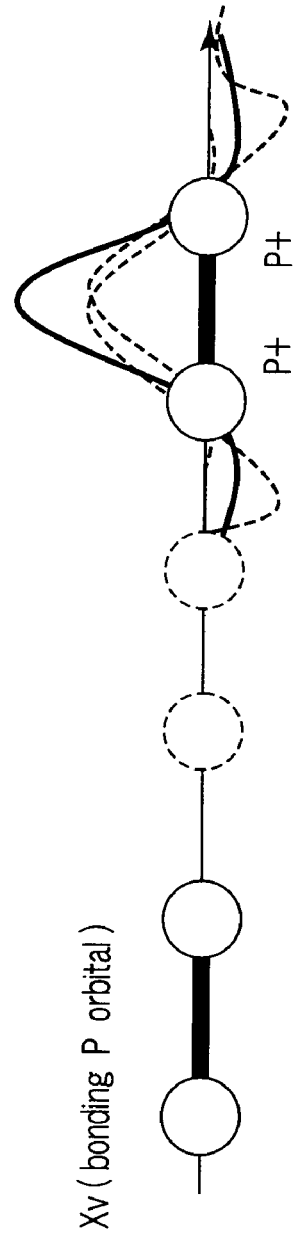
F I G. 1C

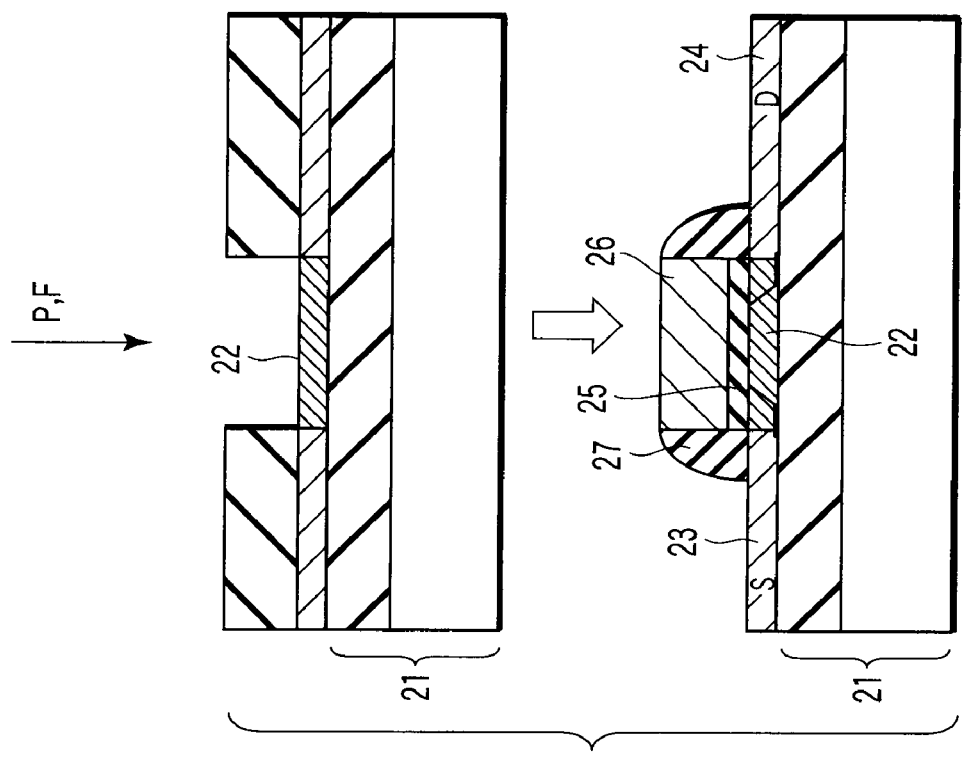
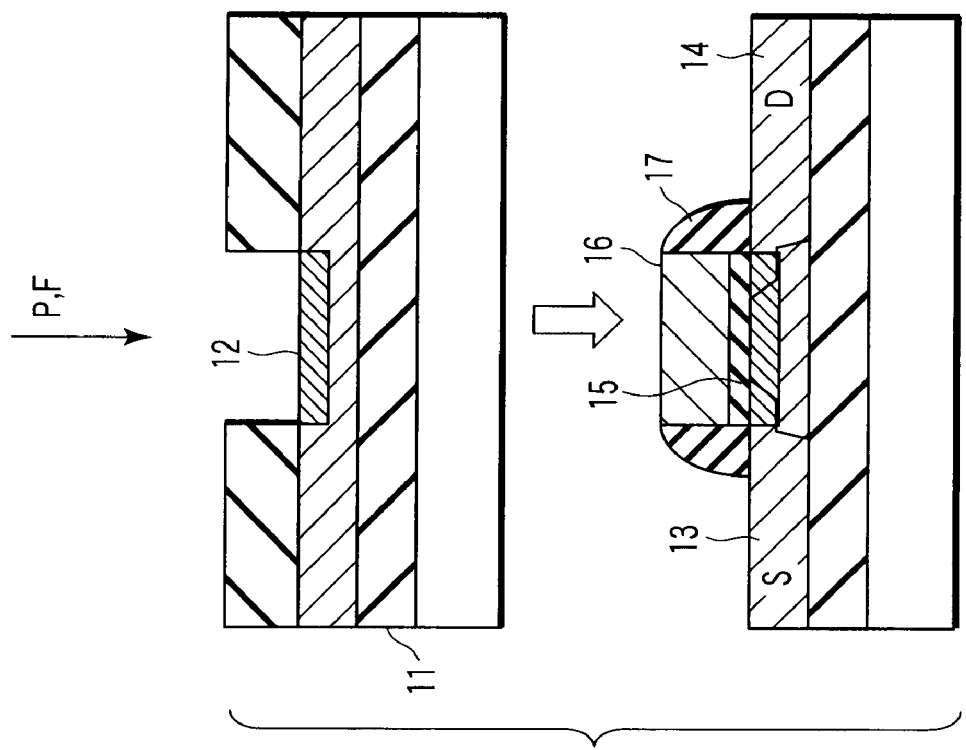

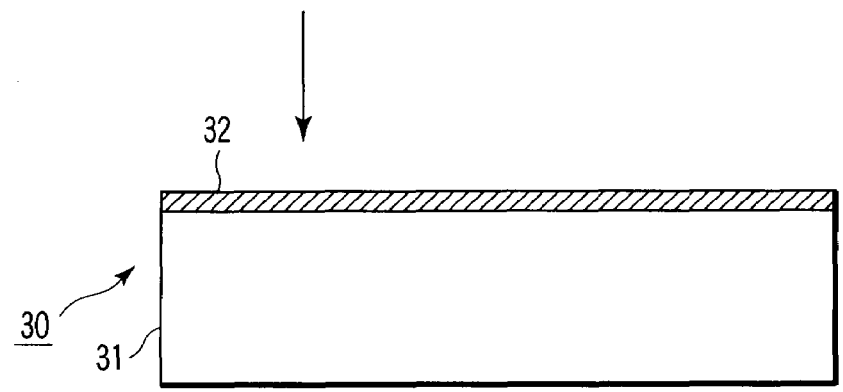
F I G. 12A
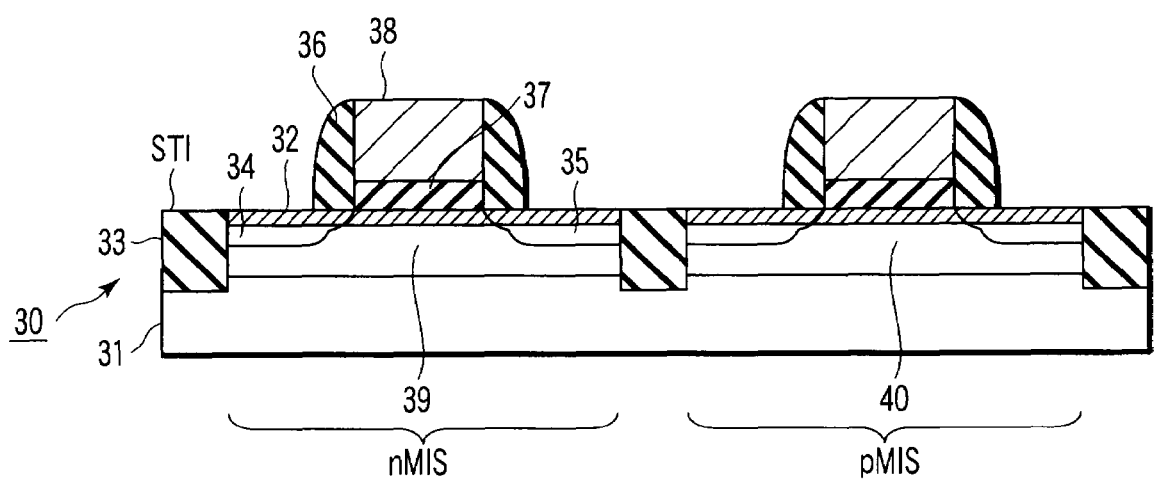
F I G. 12B

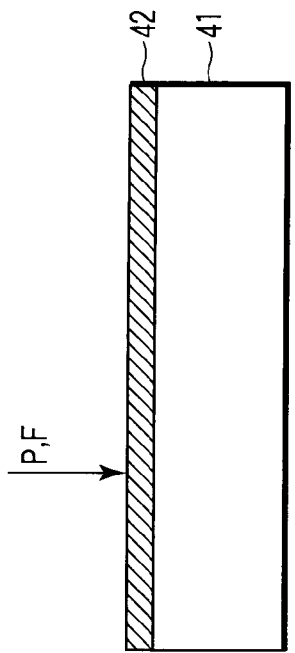
FIG. 13A
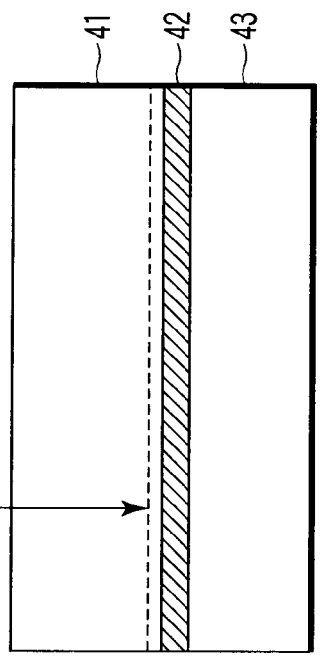
FIG. 13B
FIG. 13C
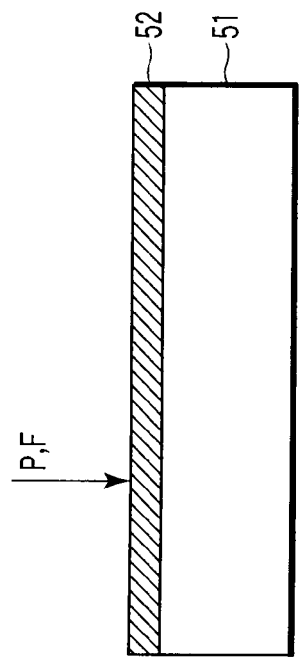
FIG. 14A
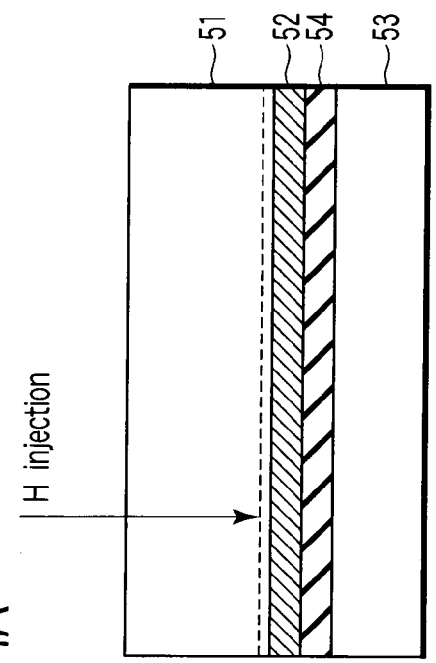
FIG. 14B
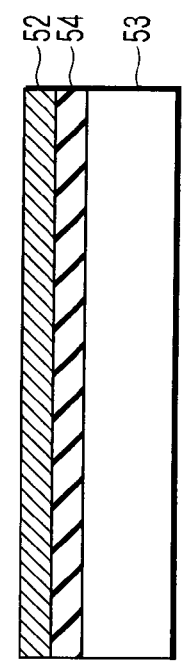
FIG. 14C

SEMICONDUCTOR DEVICE USING FILLED TETRAHEDRAL SEMICONDUCTOR

CROSS-REFERENCE TO RELATED APPLICATIONS

This application is based upon and claims the benefit of priority from prior Japanese Patent Application No. 2006-244459, filed Sep. 8, 2006, the entire contents of which are incorporated herein by reference.

BACKGROUND OF THE INVENTION

1. Field of the Invention

The present invention relates to a semiconductor device provided with a field effect transistor having a metal insulator semiconductor structure (MISFET) and using an FT (Filled Tetrahedral) semiconductor as a channel.

2. Description of the Related Art

Generally, there is an increasing demand for electronic elements to be used for configuring various information processing systems with a high processing speed as the amount of information to be processed has increased remarkably in recent years. Thus, there is also an increasing demand for high performance and high function CMOS electronic elements. For example, JP-A2001-160594 (KOKAI) discloses the use of high mobility channel material that utilizes strained Si, strained SiGe or the like for the purpose of realizing a high mobility element. Such strained Si can increase the mobility of both electrons and holes if compared with unstrained Si as tensile strain is generated in intra-planar directions and the band structure is changed due to the influence of the strain. Thus, CMOS formed by using a MOSFET having such a strained Si channel can operate at a speed higher than a conventional Si—CMOS of the same size by about 60%.

Strained SiGe has compression strain in intra-planar directions of the substrate. The band structure is changed due to the influence of the compression strain to increase the hole mobility if compared with unstrained Si. Note, however, that the electron mobility is not increased significantly if compared with the increase of the hole mobility. Thus, it is expected that a CMOS that is formed by using a MOSFET having a strained SiGe channel that shows a high Ge composition will operate faster than a strained Si—CMOS of the same size.

However, any of the above-described techniques faces difficulties in terms of process of introducing strain, process of controlling strain, minimization of interface defects, process complexity and so on. Additionally, if strained SiGe is used, the operation speed may be doubled at most. Therefore, the requirements for realizing high performance and high function CMOS electronic elements in the future have not been met satisfactorily. Phys. Rev. Lett. 52675 (1984) proposes an FT (filled tetrahedral) semiconductor structure that is realized by using rare gas. However, there has not been any instance where such a structure is applied to LSI because it is unstable in the LSI thermal process. Therefore, no study has been reported on electric characteristics of FT semiconductors.

Common knowledge technology including JP-A2001-160594 (KOKAI) and Phys. Rev. Lett. 52675 (1984) as listed above cannot satisfactorily modulate the band structure of silicon and hence cannot form a channel showing a sufficient degree of mobility.

BRIEF SUMMARY OF THE INVENTION

In a semiconductor device having a MIS-type field effect transistor comprising: a first semiconductor film; source/drain regions formed so as to be separated from each other by the first semiconductor film; a gate insulating film formed on the first semiconductor film between the source/drain regions; and a gate electrode formed on the gate insulating film, the first semiconductor film including: a host semiconductor having component atoms so bonded as to form a tetrahedral bonding structure; impurity atoms S for substituting the component atoms of sites of lattice points of the host semiconductor and the impurity atoms S being made to have a valance electron agreeing with that of the component atoms of the host semiconductor; and impurity atoms I to be inserted into interstitial sites of the host semiconductor, the impurity atoms I being bonded to the impurity atoms S and the impurity atoms I being in a state of showing an electronic arrangement of a closed shell structure.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

FIGS. 1A, 1B and 1C are schematic illustrations of the state of electrons on a real space of an X-point conduction band, that of a Γ-point conduction band and that of a X-point valence electron band out of the energy bands of silicon according to an embodiment;

FIGS. 11A and 11B are schematic cross-sectional views of an electronic element according to the embodiment, showing the process of introducing P and F into the channel region of an SOI substrate simultaneously;

FIGS. 12A and 12B are schematic illustrations of a process to be conducted after forming an FT structure on the surface of a substrate according to the embodiment in different manufacturing steps;

FIGS. 13A, 13B and 13C are schematic cross-sectional views of a substrate having an FT structure according to the embodiment in different manufacturing steps; and FIGS. 14A, 14B and 14C are schematic cross-sectional views of an SOI substrate having an FT structure on the surface according to the embodiment in different manufacturing steps.

DETAILED DESCRIPTION OF THE INVENTION

Various embodiments according to the invention will be described below in greater detail by referring to the accompanying drawings.

Firstly, the concept of an FT (Filled Tetrahedral) semiconductor to be used for the semiconductor device of the embodiment will be described.

An FT semiconductor that is to be used for the embodiment is a semiconductor having a tetrahedral bonding structure where the band structure is modulated and containing substances introduced into the inside by a quantity at which they have not hitherto been able to stably form a solid solution in order to realize a high concentration as the first mechanism.

Now, the band engineering and the high concentration doping for manipulating the band structure of a semiconductor having such a tetrahedral bonding structure will be described below. The principal mechanism of the band engineering is "the interstitial state elimination effect by an FT semiconductor", which will be described in greater detail hereinafter. A "bond length extension effect" may be used in combination. Additionally, a high concentration doping that exceeds the conventional level of stable solid solution is realized to produce a uniform distribution of the introduced substances.

These effects will be described below in detail.

(1) Interstitial State Elimination Effect by FT Semiconductor

FIGS. 1A, 1B, 1C schematically illustrate the state of electrons on a real space for each of the X-point conduction band (Xc), the Γ-point conduction band (Γc) and the X-point valence band (Xv) of the diamond structure of silicon.

As shown in FIG. 1A, when viewed in the direction of the crystal axis <111> for example, silicon atoms are located at the atom coordinates (0, 0, 0), (1/4, 1/4, 1/4) and bonded to each other by a Si—Si bond. Interstitial sites that are referred to as tetrahedral sites are arranged at the atom coordinates (2/4, 2/4, 2/4), (3/4, 3/4, 3/4). Note that the statement applies to silicon other than the type of the crystal axis <111> that is used in the embodiment.

The tetrahedral bonding structure is a crystal structure where two atoms and tow interstitial sites are arranged and followed again by two atoms with relatively large gaps. While no atoms are found on interstitial sites, anti-bonding P orbitals and bonding P orbitals extend over such sites. In other words, a state of P orbitals exists over interstitial sites where nothing is supposed to exist.

As rare gas atoms are introduced to interstitial sites, P orbitals are pushed away aside and the energies of the Xc and Xv rise. On the other hand, since s orbitals are resistive against influences, the energy of the Γc does not substantially change. In short, the principle of band modulation is to selectively modulate P orbitals by means of rare gas atoms.

Figure 2A:
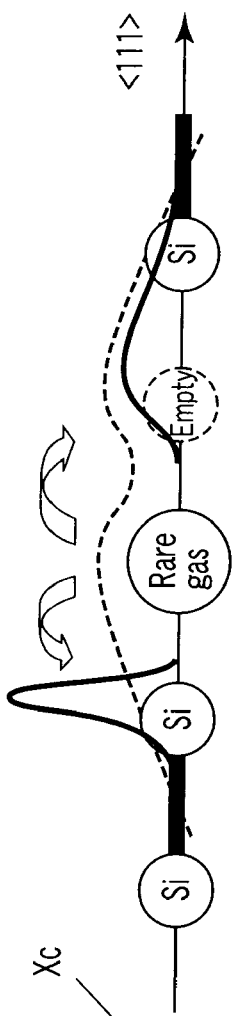
FIGS. 2A, 2B and 2C are schematic illustrations of a change in the energy of an X-point conduction band caused by an FT structure.
Figure 2B:
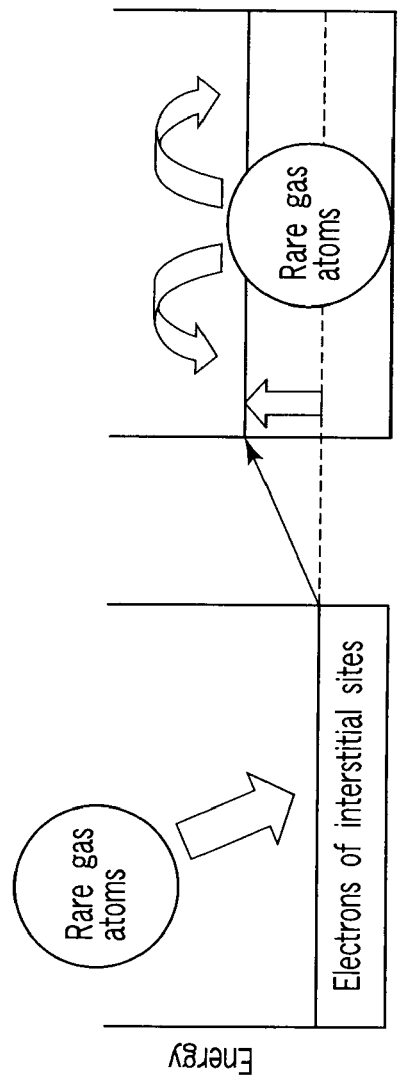
Figure 2C:
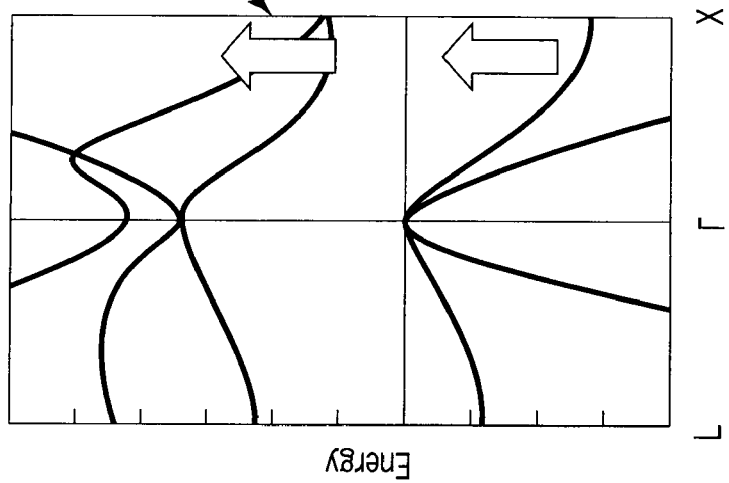

Note that an FT (Filled Tetrahedral) semiconductor is a logical substance referred to in the course of computations for the conduction band of GaAs as described in Phys. Rev. Lett. 52675 (1984). According to the computations for the band, it is found that the energy of the X point rises in FT-GaAs where He is introduced to interstitial sites of GaAs. As rare gas atoms (or molecules) having a closed shell structure are introduced to interstitial sites of silicon, electrons are eliminated from interstitial sites and the energy of the Xc rises as shown in FIG. 2A. It may be safe to assume that the phenomenon resembles the phenomenon where the level of the water contained in a tank rises when some other substance is put into it as illustrated in FIGS. 2B and 2C. In other words, it is possible to raise the kinetic energy of electronics at the Xc by eliminating spaces where electrons can exist by means of rare gas atoms. Thus, it is possible to raise the energy level of the P orbital by means of "the interstitial state elimination effect by an FT semiconductor".

Therefore, while the energy of the P orbital components that are interstitially spreading rises, the S orbital components are substantially not affected by using the principle of elimination. Then, as a result, P orbital components move beyond the S orbital components so that the S orbital components eventually form the bottom of the conductor by when the conductor is turned to FT. It has recently been found that the extent of band modulation can be freely controlled as a function of the ability of elimination of atoms of the introduced interstitial substances (atomic radius and ionic radius) and the ratio to which the substances are introduced.

Figure 3A:
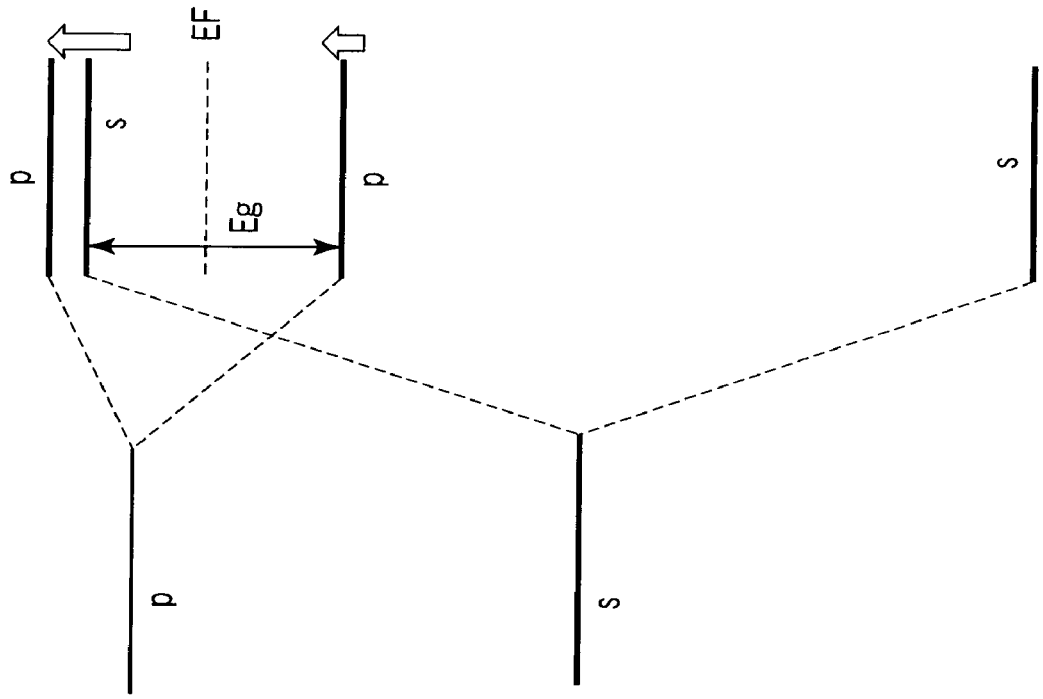
FIGS. 3A and 3B are schematic illustrations of a change in the energy of an s orbital and that of a p orbital of silicon or FT silicon.
Figure 3B:
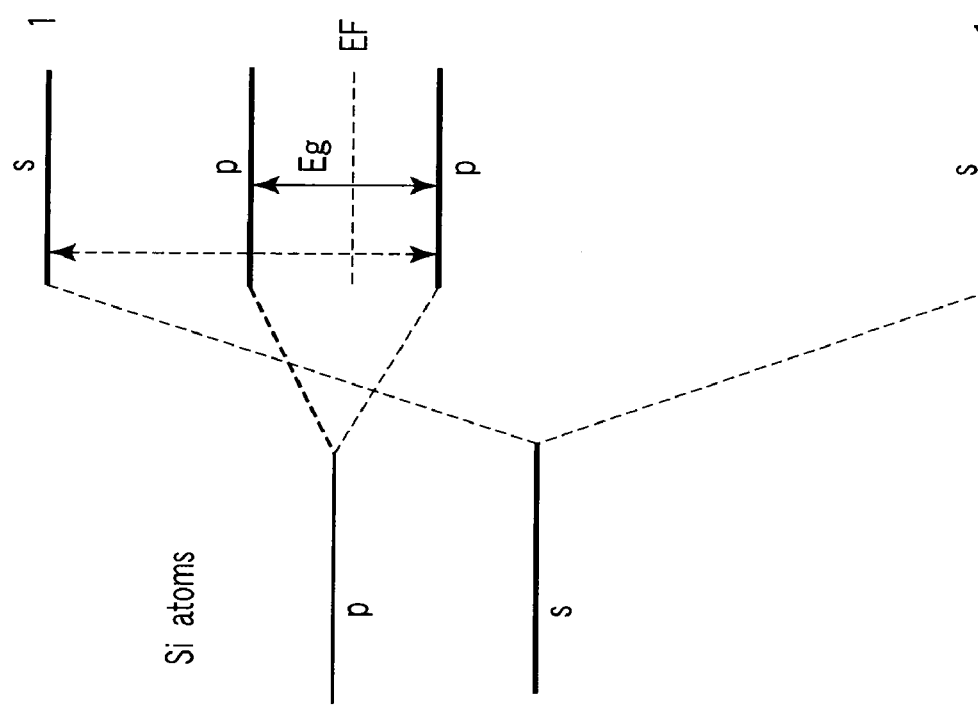

Additionally, P orbitals are influenced differently depending on the mode of spreading of the wave function between a situation where a valence electron band is formed and a situation where a conduction band is formed. Therefore, it is possible to control the band structure of the bottom of a conduction band and the apex of a valence electron band in various different ways (FIG. 3B).

When atoms exist interstitially, a deep level or a defective level may be formed in band gaps. For the FT structure of the embodiment, atoms (or molecules) having a closed shell structure and showing wide gaps are selectively used so that such levels may not be formed.

(2) Pendant Type FT Semiconductor

As described above, it is possible to control the energy of the X point if it is possible to realize "the interstitial state elimination effect by an FT semiconductor". However, for example, it is practically impossible to introduce a large number of He atoms onto interstitial sites and hold them to those positions. This is because the semiconductor is thermally treated during the manufacturing process and the rare gas elements can easily be discharged to the outside due to external diffusion of the elements during the heat treatment.

Figure 4:
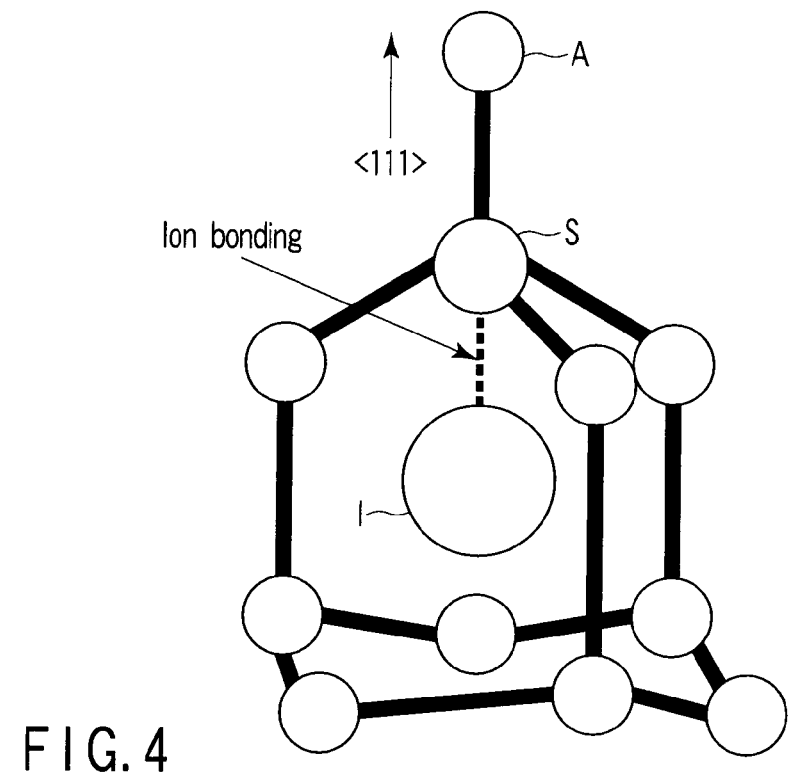
FIG. 4 is a schematic illustration of a pendant type FT semiconductor, showing the structure thereof.

FIG. 4 illustrates the state of bonding of atoms of a novel FT semiconductor of the embodiment. An FT semiconductor having a form where FT atoms are suspended is referred to as a pedant type (or suspended type) FT semiconductor hereinafter.

The pendant type FT semiconductor shows a tetrahedral bonding structure containing an atom A of a host semiconductor of Si, a hetero-atom S (pinning atom) that is a $P^+$ to be substituted by the atom at an lattice site, a hetero-atom I (FT atom) that is an $F^-$ to be inserted into the interstitial site closest to the hetero-atom S.

The hetero-atom S has a number of valence electrons that differentiates the atom A by +1 or −1 and is substituted by the atom A at the site of a lattice point to have a tetrahedral bonding structure and become ionized. The hetero-atom I take a closed-shell structure for its electron arrangement by way of a transfer of electric charge between itself and a hetero-atom S and becomes ionized. Thus, an ionic bond arises between the hetero-atom S and the hetero-atom I so that the hetero-atom S operates to pin the hetero-atom I.

Such a pendant type FT semiconductor can improve the thermal stability that is a problem of a rare gas type or a molecule type FT semiconductor. This is because, as the hetero-atom S and the hetero-atom I are forced to be moved away from each other, in electrostatic interaction takes place between them to generate force that tends to maintain the ionic bond between them. However, care should be taken when the semiconductor is to be doped to a high concentration because the ionic bond alone is not important and a lattice strain, which depends on the atomic radius and the ionic radius of the introduced substance, takes an important role. This will be described in greater detail hereinafter in terms of straining force.

As described above, candidates of the hetero-atom S are atoms that take a tetrahedral bonding structure after a chemical bonding, whereas candidates of the hetero-atom I are atoms that take a closed shell structure for the electron arrangement after a chemical bonding.

FIG. 4 schematically illustrates a pendant type FT semiconductor where the atom A of the host semiconductor is a silicon atom and the hetero-atom S that is substituted by the atom A at the site of a lattice point is a phosphor (P) atom, whereas the hetero-atom I that is to be inserted into the interstitial site closes to the hetero-atom S is a fluorine (F) atom.

The electron arrangement of the P atom is $1s^2 2s^2 2p^6 3s^2 3p^3$ and that of the F atom is $1s^2 2s^2 2p^5$. A transfer of electric charge takes place between the two atoms to form an ionic $P^+$—$F^-$ bond (PF pair). The $P^+$ substitutes the silicon atom at the lattice point to take a tetrahedral bonding structure and become stabilized. The $F^-$ ion also becomes stabilized because its electron arrangement takes a closed shell structure similar to that of neon (Ne). Now, SI pairs other than the PF pair and host materials will be discussed below.

Firstly, the tetrahedral bonding structure will be described below.

Solid substances that have a tetrahedral bonding structure and can be used for the purpose of the present invention include diamond, silicon, germanium having a diamond structure and SiC, GeC, BN, BP, AlP, AlAs, AlSb and GaP having a zinc-blende structure. Additionally, it is also possible to use $Si_xGe_{1-x}$, $Si_xGe_yC_{1-x-y}$, $Ga(P_xAs_{1-x})$, $(Ga_xIn_{1-x})P$, $(Al_xGa_{1-x})As$, $(Al_xGa_{1-x})Sb$, $(Al_xIn_{1-x})Sb$, $(Ga_xIn_{1-x})(P_yAs_{1-y})$ and $(Al_xGa_yIn_{1-x-y})P$ having a structure similar to the above listed ones. Note that $0<x<1$, $0<y<1$ and $0<x+y<1$ in the above formulas. It is also possible to use various indirect semiconductors having a tetrahedral structure by way of an sp3 hybridized orbital such as solids having a wurtzite structure.

Now, the SI pendant structure will be described below.

As for candidates of the lattice point impurity atom S and those of the interstitial impurity atom I that form an SI pendant structure, an electric charge transfer takes place between a single lattice point impurity atom S and a single interstitial impurity atom I. Additionally, candidates include combinations of $S^+$—$I^-$ or $S^-$—$I^+$, where the lattice point impurity atom S agrees with a valance electron of the compartment substances and the electron arrangement of the interstitial impurity atom I comes to show a closed shell structure. For example, if the host semiconductor is a IVb element semiconductor or a IVb-IVb compound semiconductor (diamond, silicon, germanium, SiC or the like) and the lattice point impurity atom S is substituted for the IIIb site, it is possible to use any of the combinations of Vb-VIIb, Va-VIIb, IIIb-Ia, IIIb-Ib, IIIa-Ia and IIIa-Ib for the SI pair.

If the host semiconductor is a IIIb-Vb compound semiconductor (BN, BP, BAs, AlP, AlAs, AlSb, GaP or the like) and the lattice point impurity atom S is substituted for the IIIb site, it is possible to use any of the combinations of IVb-VIIb, IVa-VIIb, IIb-Ia, IIb-Ib, IIa-Ia and IIa-Ib for the SI pair.

Further, if the host semiconductor is a IIIb-Vb compound semiconductor (BN, BP, BAs, AlP, AlAs, AlSb, GaP or the like) and the lattice point impurity atom S is substituted for the Vb site, it is possible to use any of the combinations of VIb-VIIb, VIa-VIIb, IVb-Ia, IVb-Ib, IVa-Ia and IVa-Ib. Note that, as for simplified expressions of substances, the above Ia, IIa, IIIa, IVa, Va, VIa, VIIa, Ib, IIb, IIIb, IVb, Vb, VIb and VIIb represent elements of these groups in the periodic table.

Ia represents at least an element selected from a group of Li, Na, K, Rb and Cs. IIa represents at least an element selected from a group of Be, Mg, Ca, Sr and Ba. IIIa represents at least an element selected from a group of Sc, Y, La and Lu. IVa represents at least an element selected from a group of Ti, Zr and Hf. Va represents at least an element selected from a group of V, Nb and Ta. VIa represents at least an element selected from a group of Cr, Mo and W. VIIa represents at least an element selected from a group of Mn and Re.

Additionally, Ib represents at least an element selected from a group of Cu, Ag and Au. IIb represents at least an element selected from a group of Zn, Cd and Hg. IIIb represents at least an element selected from a group of B, Al, Ga, In and Tl. IVb represents at least an element selected from a group of C, Si, Ge, Sn and Pb. Vb represents at least an element selected from a group of N, P, As, Sb and Bi. VIb represents at least an element selected from a group of O, S, Se and Te. VIIb represents at least an element selected from a group of F, Cl, Br and I.

(3) Bond Length Extension Effect of Semiconductor Having Tetrahedral Bonding Structure Firstly, changes in the band structure of a substance having a tetrahedral bonding structure that takes place when the bond length between two atoms is changed in the embodiment will be described.

As for changes in the band structure, no significant change is observed at the X point but the conduction band is reduced remarkably at the Γ point and the bottom of the Γ point falls into a state of being an S orbital when the bond length between two atoms is extended. Roughly speaking, as the bond between two atoms is extended to reduce the energy of repulsion among electrons, the anti-bonding orbital that forms the conduction band is lowered to come close to the bonding orbital that forms the valence electron band.

Figure 5A:
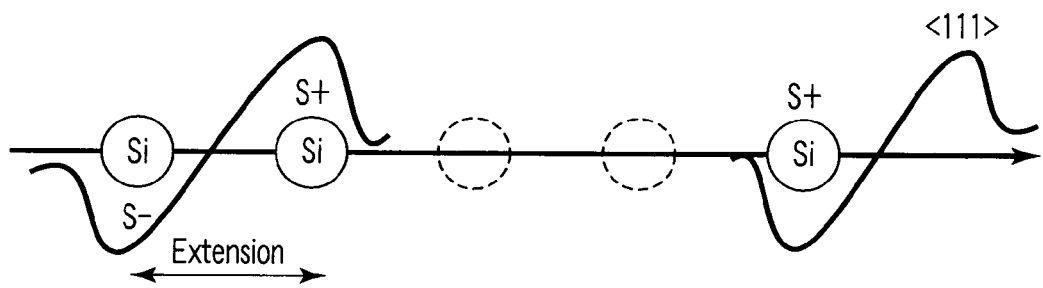
FIG. 5A is a schematic illustration of the state of electrons on a real space of a Γ-point conduction band of silicon.
Figure 5B:
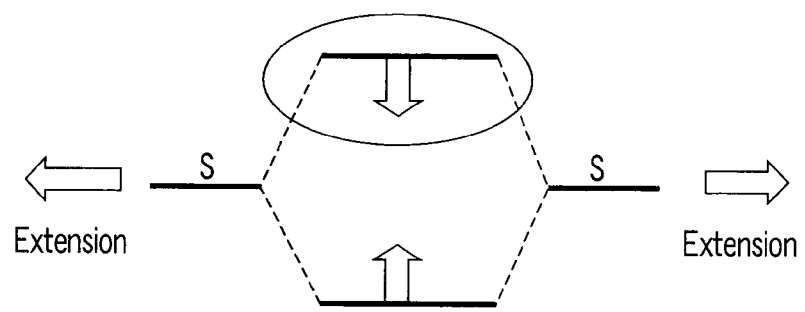
FIG. 5B is a schematic illustration of the direction of change of a conduction band and that of a valence electronic band caused by extension of the bond between Si—Si.

FIGS. 5A and 5B schematically illustrate such a state. Description will be given by referring to these figures. FIG. 5A illustrates the state of electronics on a real space for the Γ conduction band (Γc) in the diamond structure of silicon. FIG. 5B illustrates the direction of the change in the anti-bonding orbital (conduction band) and the change in the bonding orbital (valence electron band) when the Si—Si bond extends in the bonding direction. When the Si—Si bond is extended as shown in FIG. 5A, the anti-bonding orbital (conduction band) is lowered to come close to the bonding orbital (valence electron band) as shown in FIG. 5B.

Figure 6:
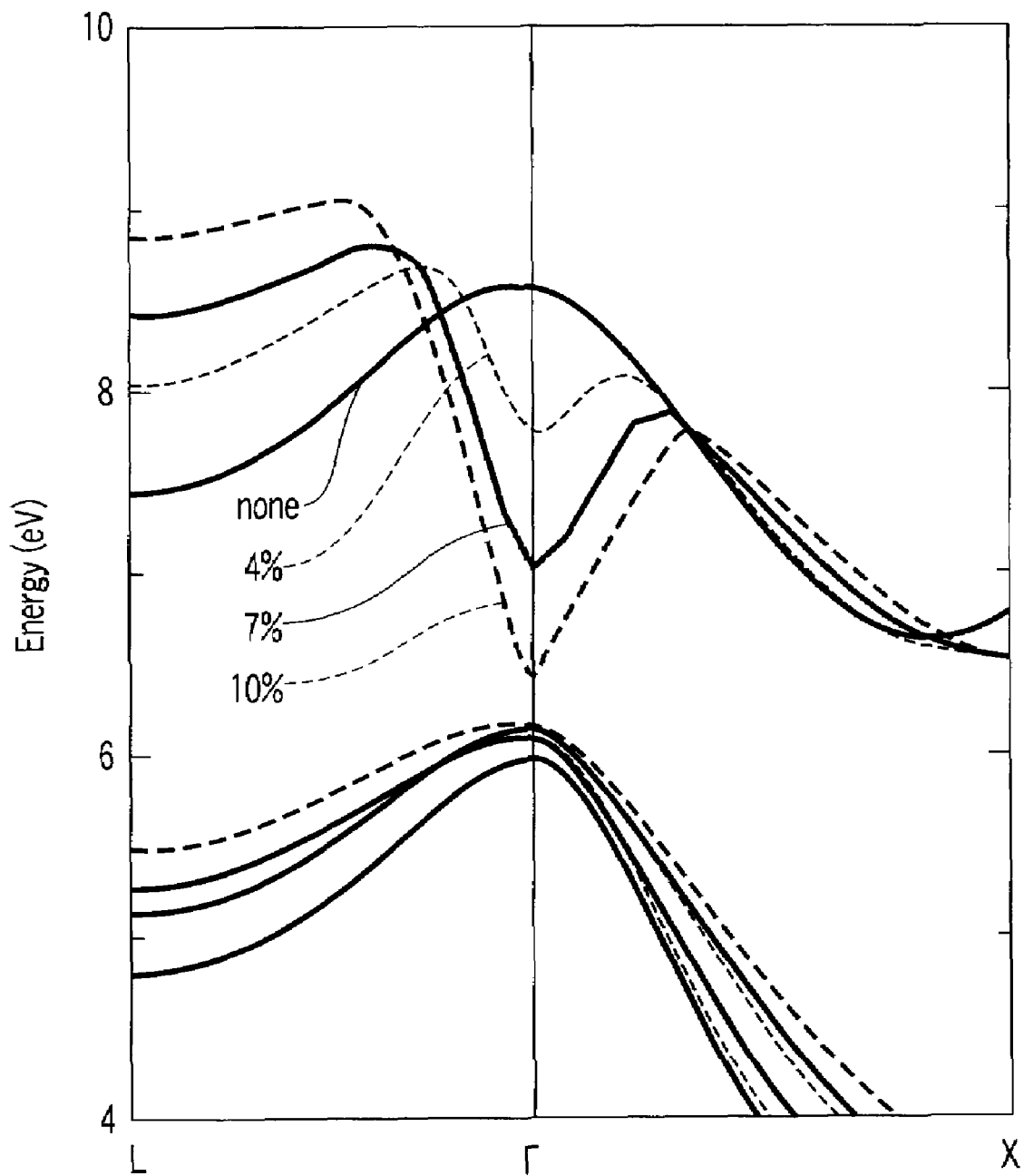
FIG. 6 is a schematic illustration of a change in the band structure when bulk Si is extended in the <111> direction.

FIG. 6 illustrates the change in the band structure when a bulk of Si is extended in one of the Si—Si directions (in the direction of <111> in this case). By analyzing the outcome of computations, it is found that the s orbital component of the bottom of the conduction band at the Γ point increases rapidly when the bond length is extended by 1% or more.

As seen from FIG. 6, as the extension of the bond length is increased from 0% to 4%, 7% and 10%, the bottom of the conduction band at the Γ point is sharpened as the characteristic of the extension. Thus, it is possible to sharpen the bottom of the conduction band at the Γ point by extending the Si—Si bond. This signifies a reduction of the effective mass and an increase of the mobility.

Figure 7A:
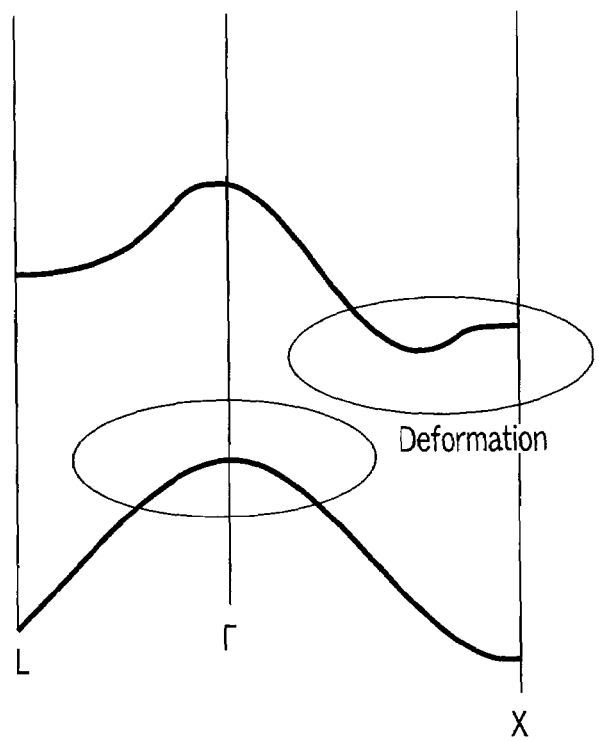
FIGS. 7A and 7B are schematic illustrations of a change in the effective mass in silicon and also a change in FT silicon.
Figure 7B:
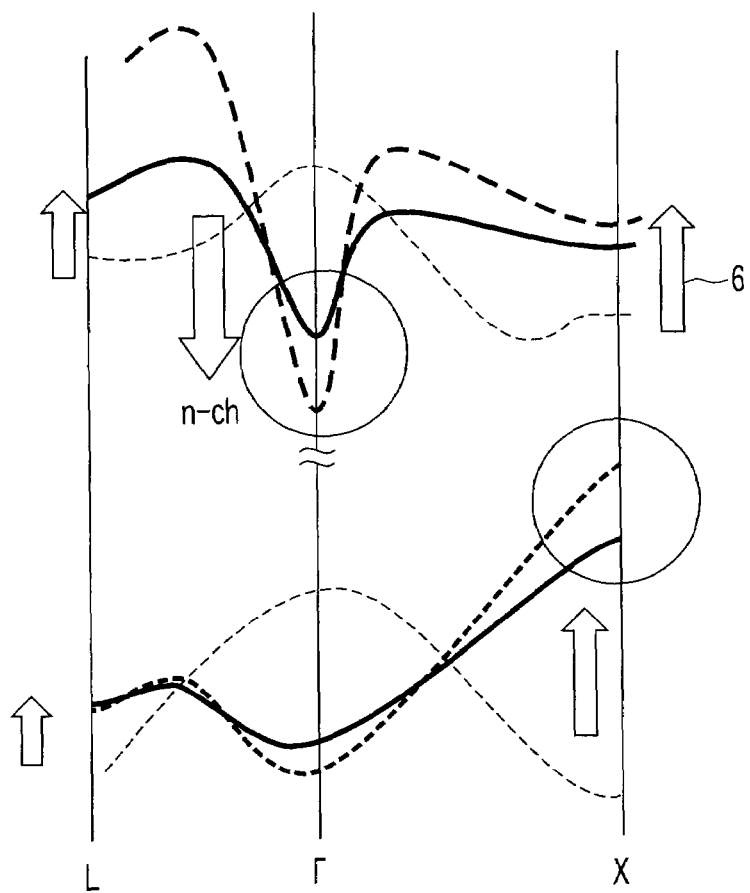

FIG. 7B schematically illustrates the change in the effective mass of silicon and that of FT silicon. FIG. 7A schematically illustrates a small band change realized by the prior art by using strain for the purpose of comparison.

Thus, it is possible to intentionally manipulate the wave function and the energy level of the Γ point, those of the X point (as well as those of each of the other points such as the L point) by forming a semiconductor device, utilizing either or both of "a pendant type FT semiconductor" and "the bond length extension effect".

Figure 8:
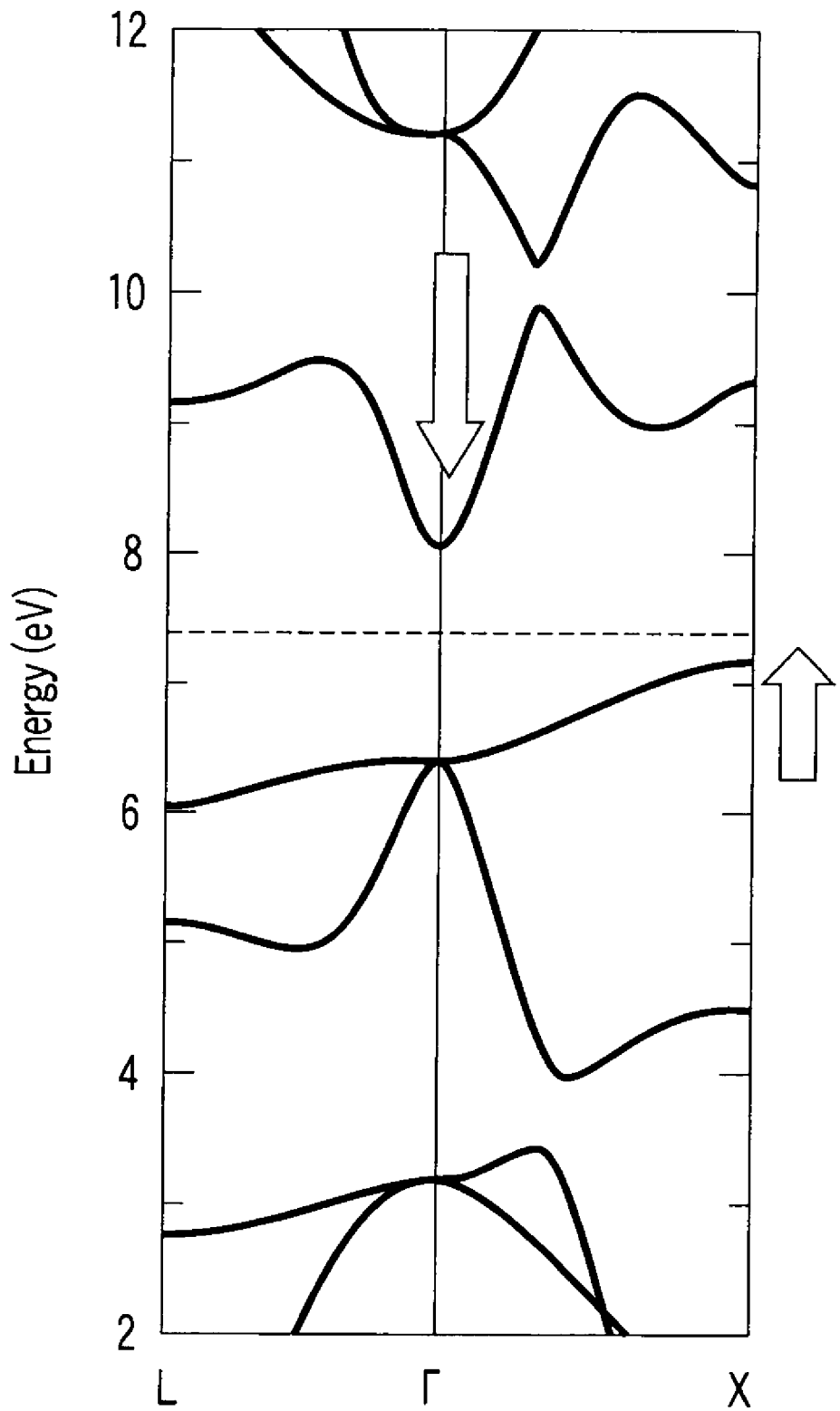
FIG. 8 is a schematic illustration of the band structure when P and F are introduced simultaneously to a large extent into silicon.

The bottom of the conduction band is sharpened at the Γ point in FIG. 7B to prove that the material is suited for forming a channel for an n-type MIS. At the same time, apex of the valence electron band is sharpened at the X point, the material is suited for forming a channel for a p-type MIS. Such a sharpening characteristic is achieved because the P orbital energy is raised by a pendant type FT semiconductor for band engineering. As a matter of fact, the effective mass change shows a characteristic as illustrated in FIG. 8 in a high density condition as a result of a simulation of introducing Si to lattice points of phosphor P and interstitially fluorine F to a large extent on the basis of the first-principle computation.

While the characteristic of a pendant type FT semiconductor is changed by using phosphor P and fluorine F in the above simulation, it is also possible to obtain a more sharpened structure by way of appropriate devices such as using chlorine Cl in place of fluorine F, using both fluorine F and chlorine Cl and adjusting the mixing ratio of F and Cl and/or using the bond extension effect. The L point can become important depending on the host substance. However, the L point shows a change similar to the X point and hence similar manipulation techniques can be used.

The atomic density of a semiconductor having a tetrahedral structure is about $5 \times 10^{22}$ cm$^{-3}$ ($8/a^3 = 5 \times 10^{22}$ cm$^{-3}$, where a is the lattice length of the host semiconductor). The inventor of the present invention has computationally proved that when a PF pair according to the invention or a similar substance is introduced into the host semiconductor, the interaction extends beyond the range of 2.5a×2.5a×2.5a. The concentration in such an instance is $1/(2.5a)^3 = 4 \times 10^{20}$ cm$^{-3}$. Therefore, a uniform arrangement of PF pairs is achieved by the interaction if the concentration is higher than the level.

(4) Behavior of Introduced Impurity

As for the materials that can be used for a pendant type FT semiconductor, it is significant that an n-type or p-type dopant that has been abundantly used in LSI processes can be utilized as hetero-atom S that operates as substitute for a lattice point site. Note that the ratio of the introduced substance is by far higher than the conventional level (to get to an order of percents).

A dopant is introduced to an order of percents in the embodiment. A technique for introducing a dopant will be described below by way of an example where phosphor (S=P) is introduced into sites of lattice points and fluorine (I=F) is introduced into interstitial sites.

To comprehend pendant type FT semiconductors, it is necessary to consider both "straining force" and "ionic interactions" brought fourth by the introduced substance. With these two forces, pairs of P and F are formed (interactions of P and F for forming pairs). Additionally, PF pairs are periodically distributed into Si (host material) by the interactions of different PF pairs. The phenomenon can be explained by using the concept of "field of strain", which will be described below. Note that the notion of "being periodically distributed" is very important for realizing the present invention.

Here, straining force will be described.

Figure 9:
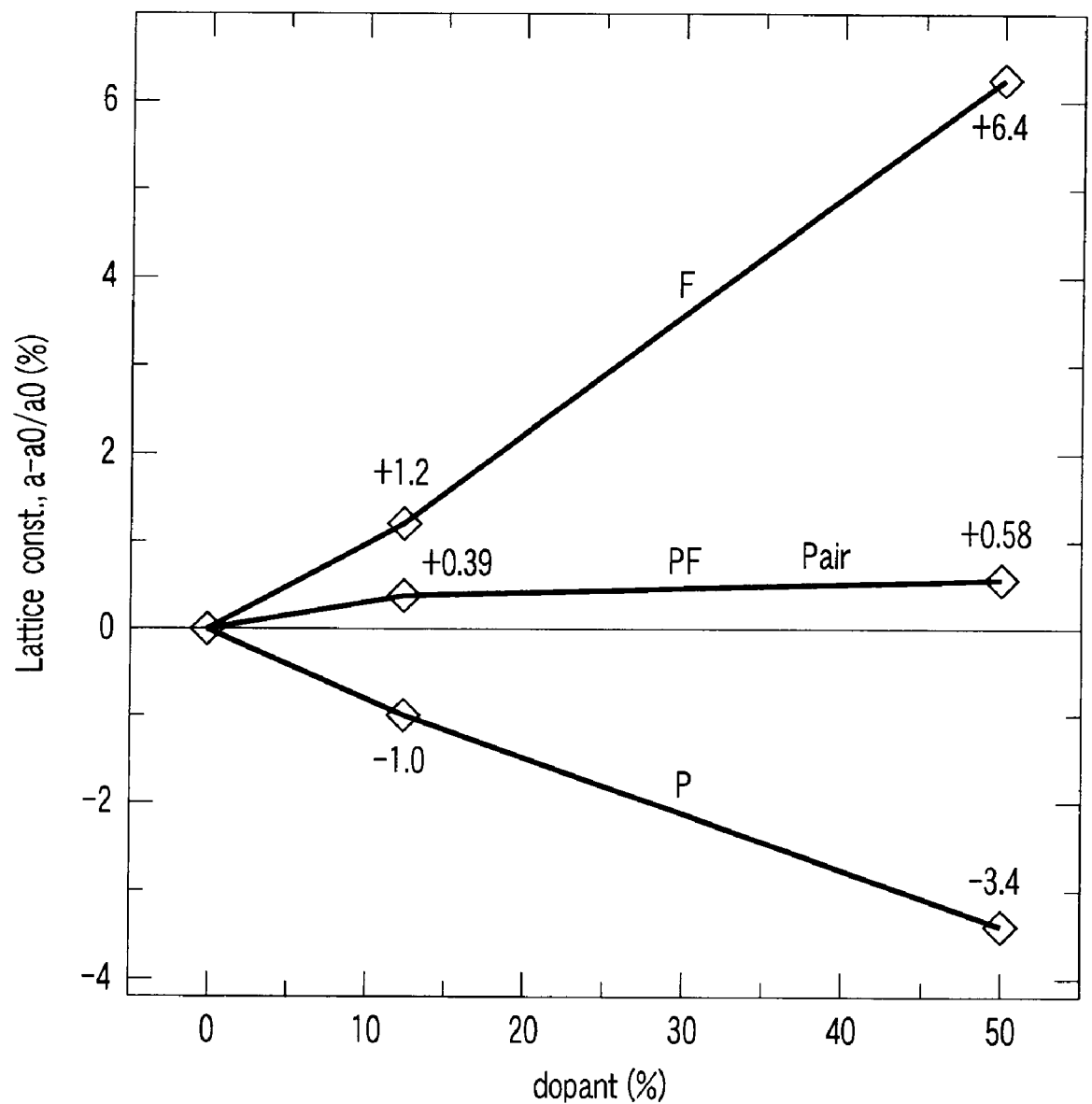
FIG. 9 is a schematic illustration of the change in the lattice constant when only P is introduced, when PF pairs are introduced and when only F is introduced into silicon.

FIG. 9 schematically illustrates the change in the lattice constant relative to the ratio to which F and/or P is introduced. More specifically, FIG. 9 shows the characteristic obtained when PF pairs (pendant type) are introduced, the characteristic obtained when only P is introduced into lattice points and the characteristic obtained when only F is interstitially introduced. FIG. 9 shows that lattice strain rapidly increases to make lattices unable to exist any longer from the viewpoint of energy when only F or P is introduced to an excessively high ratio.

While the change in the lattice constant varies depending on the introduced substance or substances, it is safe to assume that a change of about 1% as reduced to the lattice constant is "the limit of existence due to strain". In other words, when the above limit is exceeded, it is more beneficial to both the host material and the introduced substance or substances that they are separated from each in terms of energy. The limit for the ratio of the introduced substance is about 10% when "only P" or "only F" is introduced. On the other hand, when PF pairs are formed, the strain as reduced to the lattice constant remains to a very small value. In other words, when judged from the viewpoint of strain, it is possible to introduce the dopants to a ratio of 50% or higher. Thus, it is possible to prepare a very high concentration pendant type FT semiconductor by utilizing this phenomenon.

Now, a field of strain will be described below.

A PF pair to be used for forming a pendant FT is accompanied by a field of strain. In other words, it is found by computations that a field of strain is locally formed around the PF pair and its range extends to 2.5a×2.5a×2.5a, where "a" is the lattice constant. The range of the field of strain is small when the combination has a small straining force, whereas the range of the field of strain is large when the combination has a large straining force. Since fields of strain are repulsive relative to each other, it is possible to arrange PF pairs uniformly by utilizing the range of influence of a field of strain.

Particularly, when a PF pair is introduced into a region of a×a×a of the host silicon, the field of strain becomes large and heavy so that PF pairs are arranged densely and periodically in a space. Note that the ratio of an introduced dopant substance is conventionally very small if compared with the present invention so that common knowledge technology cannot realize periodicity by using a field of strain. (Takahiro Shinoda et. al. Nature 437 p. 1128, 2005).

Now, the ionic interaction will be described.

When a pendant FT structure is formed, electrons move among hetero-atoms S and I. At this time, ionic attractive force operates between P and F. When no move of electrons takes place, electrons are found excessively around P, while electrons are scarcely found around F. As electrons move, P and F are attracted to each other and become stabilized because P has a positive electric charge and F has a negative electric charge. The ionic interaction between P and F becomes operational above a certain concentration and the range is larger than the range of a field of strain. The force between a PF pair that is produced and another PF pair can be regarded as the force between dipoles. As a result of energy computations, a tendency that the directions of polarization become aligned is observed.

Now, stabilization by forming a PF pair will be described.

When P and F exist at the same time, attractive force appears between P and F due to "the straining force" and "the ionic interaction" as described above so that the host material is stabilized in terms of energy. For instance, when P and F are introduced to a ratio of 12.5%, an effect of stabilization of 1.2 eV is observed per PF pair if compared with a situation where only P or F is introduced.

The advantages of "a pendant type FT semiconductor" and "the bond length extension effect" will be summarized below.

1. It is possible to raise the electron energy at the X point (or the L point) and elevate the X point (or the L point, whichever appropriate) of the band structure by using a pendant type FT structure for the semiconductor substance having a tetrahedral bonding structure and introducing a substance that restricts the moving region of electrons into interstitial gaps. At this time, the bottom of the conduction band is sharpened. Additionally, it is possible to sharpen the apex of the valence electron band by controlling the substance to be introduced and the ratio of the introduced substance.

2. It is possible to convert the state of the bottom of the conduction band at the Γ point to the state of an s orbital by extending the inter-atomic bond of a semiconductor substance having a tetrahedral bonding structure. With the technique, it is possible to provide a feasible silicon high mobility element showing a mobility level close to or higher than that of a high mobility semiconductor such as GaAs. Then, it is possible to provide an electronic element showing a mobility level higher than a pendant FT structure alone by combing the advantage with a pendant FT structure having the advantage of 1 as described above.

3. It is possible to provide an electronic element having the advantages of 1 and 2 listed above when a semiconductor substance having a tetrahedral bonding structure other than silicon is used. Additionally, it is possible to prepare a substance showing a higher mobility level by turning a substance such as GaAs that originally shows a high mobility level to an FT semiconductor or adopting the bond extension effect.

Now, an embodiment of electronic element according to the present invention will be described below in greater detail.

Firstly, simple techniques of introducing a substance to be introduced into a pendant structure will be described. A basic technique is the ion doping method. It is a technique of growing the surface layer that has been turned amorphous by solid phase epitaxial growth, utilizing the crystallinity of the underlying host material.

When the host material is doped with an impurity to a high concentration level, it is not possible to realize solid phase epitaxial growth only by doping the host material with P, for example, to a high concentration level. With such a process, highly concentrated P reacts with silicon to deposit a silicon compound and remarkably obstruct the epitaxial growth. Such a phenomenon of deposition is mainly caused by lattice strain and hence it is possible to see the crystallinity of the underlying silicon and hence realize epitaxial growth when the strain is alleviated.

In the embodiment, a silicon substrate is doped simultaneously with P and F in order to sufficiently alleviate the strain, epitaxial growth is realized.

Now a bond length extending technique will be described.

1. A (111) substrate is extended in the normal direction of the substrate, or the <111> direction, by forming a film of a substance having a small lattice constant or a substance showing a thermal expansion coefficient greater than the substrate on the latter. While it is most simple to extend the substrate in the <111> direction, it is also possible to extend a substrate in the direction of some other bond length when the substrate has some other bearing. Note that ( ) indicates (face) and < > indicates <the direction of crystal: the normal direction perpendicular to the face>.

2. A (111) substrate is extended in the normal direction of the substrate, or the <111> direction, by burying a substance having a thermal expansion coefficient different from the substrate in an intra-planar manner to transversally apply compression stress. While it is most simple to extend the substrate in the <111> direction, it is also possible to extend a substrate in the direction of some other bond length when the substrate has some other bearing. For example, the device illustrated in FIGS. 10A and 10B for an STI preparation process is effective. It is only necessary to apply intra-planar compression stress in the case of a (111) substrate. Similarly, it is only necessary to apply tensile stress in the direction of <1-1-1> in the case of a (110) face.

3. An SI pair is selected so as to locally extend the bond length. For example, an AsF pair may be conceivable as an SI pair that can locally produce a large lattice constant. The mode of oscillation of the SI pair differs from that of Si itself.

4. An ISSI pair is selected so as to locally extend the bond length. The ISSI pair is so selected as to increase the local lattice constant and extend the bond length by the SS pair. The mode of oscillation of the ISSI pair differs from that of Si itself. Additionally, oscillations of the SI pair part and those of the SS pair part appear.

A change arises to the Raman-active oscillation mode due to the extension of the bond length. For example, in the case of a Si bulk, there is a Raman-active oscillation mode at 520 $cm^{-1}$. However, an oscillation mode appears at the lower frequency side as a result of the extension of the bond length. In the case of a local extension, the peak of the oscillation mode is broadened so that the peak intensity may be very low when the extended bond density falls below $5 \times 10^{19}$ $cm^{-3}$.

If such is the case, the extended actual bond length can be computationally determined in a manner as described below, although the extension may appear to be not greater than 1%.

In the following formulas, de is the introduced locally extended bond density and d0 is the bond density of the bulk material, whereas L is the strain detection limit of the Raman analysis (0.1%=0.001 when a μ spot is used) and E and Em are the actual bond extension (%) and the bond extension (%) as estimated from the observed peak respectively.

1. When $de/d_0 \leq L$ and the locally extended bond shows a low density, the actual bond extension E is expressed by the formula below.

$$E = Em \times L \times d_0/de$$

In the case of silicon, for example, the actual bond extension E is 2.5% when Em=0.5%, de=$1 \times 10^{19}$ $cm^{-3}$ and $d_0$=$5 \times 10^{22}$ $cm^{-3}$.

2. When $de/d_0 \geq L$ and the locally extended bond shows a sufficiently high density, the actual bond extension E (%) is equal to the bond extension Em (%) as estimated from the observed peak. When preparing a high mobility element by utilizing both the bond length extension effect and a pendant type FT semiconductor, lattice point impurity atoms S and interstitial impurity atoms I are introduced into the host semiconductor and forming a substance showing a thermal expansion coefficient different from the host semiconductor as described above to extend it in the <111> direction of the pendant type FT semiconductor.

Figure 10A:
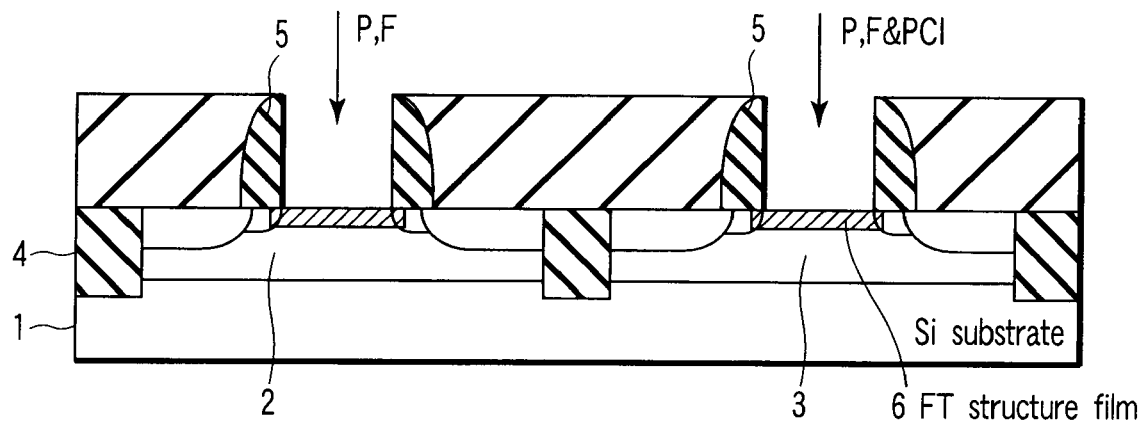
FIGS. 10A and 10B are schematic cross-sectional views of an electronic element of the embodiment, showing the process of introducing P and F into the channel region simultaneously.
Figure 10B:
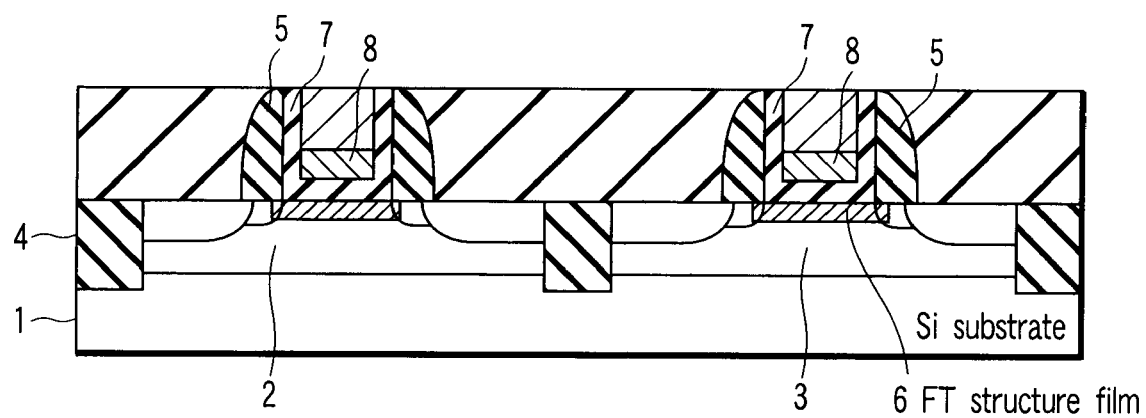

FIGS. 10A and 10B are schematic cross-sectional views of the first example of electronic element of the embodiment in different manufacturing steps.

In the manufacturing process, after forming an element separating region 4 in a silicon (Si) substrate 1 typically in the <111> direction, a P-well region 2 and an N-well region 3 are formed by thermally diffusing an impurity. Then, after forming a side wall 5 at the gate electrode side wall, source/drain regions are formed in a self-aligning manner by way of an ordinary manufacturing process and a channel part is opened in the gate forming region.

Then, phosphor (P) and fluorine (F) are introduced simultaneously into the channel part by way of an ion implantation process. Subsequently, the solid phase epitaxial growth is accelerated by way of a heat treatment process to regain a high crystallinity. As a result of the heat treatment, the channel part that is formed by a film 6 having an FT structure and a high mobility level is exposed to the surface layer.

Thereafter, it is possible to introduce boron (B) and phosphor (P) in order to prepare nMIS and pMIS as dopant. Alternatively, a substrate into which B and P are introduced excessively in advance may be used.

The energy, the dose (including the ratio, the difference, the order and the distribution), the bearing of the substrate surface, the tilt angle, the substrate temperature and other factors are to be optimized for the ion implantation process. For the solid phase epitaxial growth process again, it is necessary to optimize the temperature, the annealing time, the rate of raising and lowering the temperature, the gas atmosphere and other factors for the ion implantation process. An active layer (film) having an FT structure is formed in the host semiconductor by means of a technique of combining ion implantation and annealing, although a channel layer having an FT structure may alternatively be formed by thermal diffusion. Still alternatively, a channel layer having an FT structure may be formed by means of a technique other than those described above.

Then, a groove-shaped gate insulating film 7 is formed to cover the channel layer typically by means of a CVD (chemical vapor deposition) system and then a gate electrode 8 is formed by using polysilicon (poly-Si) or metal to bury the groove.

When a lattice point hetero-atom S and an interstitial hetero-atom I are coupled as in the case of a PF pair, there arises a specific oscillation mode that is different from the lattice oscillation of the host semiconductor. Then, it is possible to analyze the structure by means of infrared spectrometry or Raman spectrometry. In the case of a PF pair, for example, an infrared active oscillation mode exists at or near a wave number between 150 and 200 $cm^{-1}$, which can be detected with ease. Thus, it is possible to check if SI pairs are formed in the host semiconductor or not by examining the oscillation mode by means of infrared spectrometry or Raman spectrometry.

As an indirect and simple method of detecting the existence of SI pairs, it is also possible to use an electric gauging technique using an electric resistance or a Hall coefficient. When an n-type or p-type dopant is used as lattice point hetero-atom S, the substrate before being doped with an interstitial hetero-atom I is of the n-type or the p-type, whichever appropriate, and shows a low resistivity.

As hetero-atoms S and hetero-atoms I are paired, the number of free carriers is reduced to make the substrate electrically highly resistive due to the charge compensation of the hetero-atoms S and the hetero-atoms I. Therefore, it is possible to know if SI pairs are formed or not by seeing the electric resistance and the Hall coefficient (the carrier density) before and after the doping of hetero-atoms I. If there is a region where the dose of the dopant exceeds $10^{20}$ $cm^{-3}$, a minute shift is noticed between the spectrum of only hetero-atoms S and the spectrum that is observed after forming SI pairs when the electronic state of the dopant is gauged by means of an XPS. After the production of SI pairs, the distribution of S and that of I agree with each other when observed by way of an SIMS.

FIG. 11A schematically illustrates the use of an SOI substrate 11 as the first modification to the above-described embodiment.

In the instance of the first modification, a silicon film is formed on the insulation film that is formed on a substrate. Then, the silicon film is subjected to epitaxial growth in a transversal direction to form an SOI substrate 11. An electronic element is formed on the SOI substrate 11. The electronic element has a channel layer formed by an FT structure film 12 that is formed in an epitaxial crystal film. The electronic element has a gate electrode 16, a source region 13, a drain region 14, and a channel layer sandwiched between the source region 13 and the drain region 14 and formed by using the FT structure film 12. Additionally, a gate insulating film 15 and the gate electrode 16 are arranged on the channel layer and surrounded by a side wall 17.

FIG. 11B schematically illustrates the second modification made to the above-described embodiment by using a very thin SOI substrate 21. In the instance of FIG. 11B, an electronic element having a channel layer that has by turn an FT structure is formed in an epitaxial crystal film that is thinner than the ordinary SOI substrate 11 illustrated in FIG. 11A. The electronic element has a gate electrode 26, a source region 23, a drain region 24 and a channel layer sandwiched between the source region 23 and the drain region 24 and formed by using the FT structure film 22. Additionally, a gate insulating film 25 and a gate electrode 26 are arranged on the channel layer and surrounded by a side wall 27.

In this way, it is possible to form an electronic element by using an FT structure film if a thin epitaxial crystal film (a host semiconductor where component atoms are bonded to form a tetrahedral bonding structure) is used as SOI substrate.

FIGS. 12A and 12B are schematic cross-sectional views of the second example of electronic element of the embodiment in different manufacturing steps.

In the second example of electronic element, the electronic element is formed by way of an ordinary process, using an FT structure substrate 30 where an FT structure film 32 is formed on the entire surface of a silicon (Si) substrate 31.

Firstly, after removing the natural oxide film on the surface of the silicon substrate 31 by etching, an FT structure film 32 is formed on the substrate by implanting P and F simultaneously and entirely to one of the surfaces of the silicon substrate 31 at a low rate by ion implantation. At this time, after removing the natural oxide film, the silicon substrate is turned amorphous by implanting a small quantity of silicon to and near the surface to prevent the channeling effect from taking place in the vertical direction of the substrate by P ions and F ions in the ion implantation process. As a result of this process, it is possible to form a PF doped layer that is highly concentrated to a concentration of $2 \times 10^{22}$ $cm^{-3}$. Note that F ions are implanted to a concentration of $3 \times 10^{22}$ $cm^{-3}$ so as to completely cover the P ion distribution.

Subsequently, a very thin FT structure film is formed on and near the surface of the substrate by annealing the substrate at 500° C. for about 3 minutes in an Ar gas atmosphere. The substrate can be doped to a high concentration and an FT structure film 32 can be formed. Excessive F can be diffused externally in the stage of operation. The strain effect as shown in FIG. 9 also relates to the mechanism of externally diffusing excessive interstitial F.

Then, an isolating region 33 for separating a pMIS transistor forming region and an nMIS transistor forming region is formed in the FT structure substrate 30 typically by means of a technique of element isolation (STI: shallow trench isolation). It is possible to add strain to the channel section during the time of forming the element isolating region by the STI.

The stress may be applied one-dimensionally in the channel direction (mono-axially) or longitudinally (two-dimensionally). It is also possible to control the strain by way of a process, using the difference of lattice constant or that of thermal expansion coefficient between the gate insulating film and the channel. For example, a mobility improvement of not less than 50% is observed after introducing strain, using a (111) substrate and compression strain applied from the STI isolating region, if compared with before the introduction (although the strain is not greater than 1%).

Alternatively, the isolating region 33 may be formed by using a LOCOS (local oxidation of silicon) technique. With such a technique, a P well 39 is formed in the nMIS transistor forming region, while an N well 40 is formed in the pMIS transistor forming region. The P well 39 and the N well 40 can be formed by means of ion implantation, using a mask having an opening only in those regions. A gate insulating film 37 is formed on the FT structure film 32.

The gate insulating film 37 is produced by forming a 3 nm-thick silicon oxidation film (gate oxidation film) on the substrate by using a CVD system under process conditions for raising the substrate temperature to 400° C. in an oxygen atmosphere. Additionally, polysilicon is formed on the silicon insulating film to a thickness of 50 nm by means of the CVD system.

Thereafter, a resist mask that exposes the entire surface except a region having a desired gate length is formed on the polysilicon film by lithography and then a dry etching process is conducted to remove the polysilicon film and produce a gate electrode 38.

Then, the resist is removed typically by ashing to form an extension to the source/drain regions (SD). A resist mask is formed to cover the pMIS region 39 and extension P and pocket BF2 are implanted into the nMIS region. Likewise, a resist mask is formed to cover the nMIS region and extension BF2 and pocket P are implanted into the pMIS region.

Subsequently, a silicon nitride film is formed over the entire surface of the substrate by means of a CVD system. Then, a side wall 36 is formed along the lateral wall of the gate electrode by etching. After forming the side wall 36, source/drain regions 34, 35 are formed. The pMIS region is covered by resist and n-type impurity P is implanted into the nMIS region. At this time, the gate electrode section located in the nMIS region is also turned to the n-type. Likewise, the nMIS region is covered by resist and p-type impurity B is implanted into the pMIS region. The gate electrode located in the pMIS region is also turned to the p-type.

After the ion implantation process, an activation/annealing process is conducted. The process conditions include a process temperature of 1050° C. and a process time of 30 seconds. The heat treatment technique to be used may be selected appropriately from known heat treatment techniques including spike annealing, laser annealing and lamp annealing etc. Once an FT structure is formed, the work is very stable due to the strain effect and the ionic bond so that the channel section is not structurally destroyed by the activation/annealing process.

In an experiment, an nMIS region and a pMIS region are formed for silicon channels by way of the above-described manufacturing process on a Si substrate having no FT structure for the purpose of comparison.

As a result of comparison, it was found that the most significant difference of mobility is that an improvement of 3 times in terms of peak mobility and that of not less than 2.5 times over the entire high electric field region that is influential to the drive performance in actual operations can be achieved at the nMIS side by the embodiment. Similarly, an improvement of 2.5 times in terms of peak mobility and that of not less than 2 times over the entire high electric field region can be achieved at the pMIS side.

Subsequently, a large number of MIS structures were prepared and the statistic distribution of threshold value Vth was compared between Si substrates according to the embodiment and conventional Si substrates. The dispersion of Vth was about $3\sigma=50$ mV for both nMIS and pMIS when an ordinary Si channel was used. On the other hand, the dispersion of Vth was about $3\sigma=5$ mV, which is smaller than the conventional one by a digit, when an FT structure channel of the embodiment was used.

Thus, it is possible to automatically adjust the uniformity and the periodicity of the impurities by utilizing strain as a characteristic of an FT structure semiconductor channel. For this reason, the dispersion of the threshold value is suppressed to a negligible level if compared with conventional channels.

With the structure of the electronic element of the embodiment, the internal resistance of the source/drain regions is reduced to less than 1/3 of that of conventional elements. This improvement is attributable to the fact that high concentration doping is realized and the effective mass is lowered for both electrons and holes according to the present invention. Thus, the present invention can be utilized as a technique effective for activating the source/drain regions and the electrode sections. Then, it is possible to prepare an electronic element having a MIS structure that operates at high speed with a low power consumption rate.

FIGS. 13A, 13B and 13C are schematic cross-sectional views of the third example of electronic element of the embodiment in different manufacturing steps.

In this third example of electronic element, the substrate is formed by cementing and has an FT structure film on one of the surfaces thereof. The part on and near the substrate interface that is damaged by ions is eliminated from the FT structure substrate.

Firstly, a silicon (Si) substrate 41 is typically doped simultaneously with P and F by ion implantation over the entire surface thereof and subsequently heated for solid phase epitaxial growth. In such a manufacturing process, there is a part on and near the interface between the substrate 41 and the FT structure film 42 that is damaged when the substrate 41 is doped with P and F to a high concentration and subjected to solid phase epitaxial growth in a short period of time.

As a countermeasure, a cemented substrate may be used. Firstly, P and F ions are implanted into the entire area of one of the surfaces of a silicon substrate 41 as shown in FIG. 13A. At this time, P and F are implanted to a certain depth to form an FT structure film 42 to a thickness greater than the target thickness. Subsequently, solid phase epitaxial growth is accelerated by raising the substrate temperature to about 550° C. to 750° C.

Then, a supporting silicon substrate 43 is cemented to the FT structure film 42 by welding as shown in FIG. 13B. At this time, hydrogen ions H are implanted to and near the FT structure/substrate interface at the side of the substrate 41 and annealed at about 400° C.

After the annealing process, the damaged part is scraped off by means of CMP (chemical mechanical polishing) and a hydrofluoric acid process down to the FT structure film 42 for a surface treatment. An electronic element such as a CMOS is formed on the substrate having the FT structure by way of the above-described process. As a result of such a process of alleviating the damages, an improvement of about 10% is observed for the mobility for the prepared electronic element.

FIGS. 14A, 14B and 14C are schematic cross-sectional views of a modified third example of electronic element of the embodiment in different manufacturing steps. In this modified example, an oxide film is formed on the supporting substrate to be cemented. In other words, it is a supporting substrate 53 to be cemented and the oxide film 54 and the FT structure film 52 are bonded to each other.

An FT structure film 52 is formed on a Si substrate 51 as shown in FIG. 14A. The process described above by referring to FIG. 13A is to be followed. Thereafter, the silicon oxide film ($SiO_2$) 54 formed on a supporting silicon substrate 53 is cemented to the FT structure film 52 by welding as shown in FIG. 14B.

Then, the damaged part of the substrate is scraped off by means of CMP and a hydrofluoric acid process down to the FT structure film for a surface treatment as in FIG. 13C.

Thus, it is possible to manufacture a substrate where the damage caused by ion implantation is minimized by using the third example of electronic element and the modification thereof as described above.

While the process of FIGS. 14A, 14B and 14C shows substantially same as that of FIGS. 13A, 13B, 13C, it is possible to prepare an FT type substrate of SOI where a BOX oxide film is involved. Then, it is possible to manufacture an electronic element having a MIS structure and showing a high mobility level by way of the manufacturing process described above by referring to FIG. 12B by using such an FT type substrate.

The additional advantages of the process selection and the substance selection for an FT structure substrate of the embodiment will be described below.

1. It is possible to realize a uniform concentration of impurities by utilizing strain that can be produced by the FT structure if P and B are implanted only to a low concentration. Then, it is possible to reduce dispersion of threshold value (Vth) among MIS elements due to such a uniform concentration. Consequently, it is possible to realize uniformity of operation characteristics by preventing dispersion of threshold value. When dispersion of threshold value occurs, certain electronic elements may be driven by a voltage, whereas other electronic elements may not be driven by the same voltage.

As described above by referring to FIG. 9, strain is introduced into an FT structure when the FT structure film is prepared by implanting ions of P and F simultaneously. The strain can effectively be used to make it possible to produce a highly uniform and periodical distribution for P and B if they are introduced only to a low concentration. P is used to produce an n-type while B is used to produce a p-type. There is an arrangement of P and B that alleviate the overall strain when P and B are introduced excessively. Then, a uniform distribution is accelerated to produce such a stable structure.

The introduction of P and B by ion implantation also provides a remarkable effect of driving the part of the source/drain regions (SD) at high speed along with other effects. It is possible to introduce P and B excessively to realize a considerably high concentration when the part of the SD regions of the FT structure is used. When P an F are introduced, the strain tends to extinguish to stabilize the structure in terms of energy if it is possible to introduce a dopant that reduce the lattice constant.

The strain is expected to extinguish by introducing P and B by about 10% of the introduced dopant when forming an FT structure. Such a degree of introduction of P and B is higher than the conventional level of introduction of P and B into semiconductors by one or more than one digits.

Since there is a tendency of uniformizing the distribution in order to alleviate the strain, there arises no phenomenon of dopant deposition that is observed when Si is doped by way of a conventional process. Since Si is doped to a high concentration and the dopant is active, it is possible to prepare an SD part that shows a low resistance and where electrons and holes can move at high speed. The resistance of the SD part takes a large part in the overall resistance of a MIS structure. From this viewpoint, an FT structure is very effective for remarkably reducing the resistance of the SD regions.

Particularly, an FT structure that uses interstitial F can externally disperse excessive F to reduce the adverse effects of charge centers that appear in the upper gate insulating film, along the channel/gate insulating film interface and in the inside of the capacitors for storing electric charges. A charge center is typically an oxygen deficiency, a dangling bond or the like and it is believed to appear particularly remarkably in highly dielectric oxide insulation films. Thus, it is possible to improve the leak characteristic, reduce the shift of the threshold value Vth in MIS structures and improve the long term reliability (SILC/NBTI/PBTI etc.) by reducing charge centers.

Now, the fourth example of electronic element of the embodiment will be described below.

The fourth example of electronic element is suitable when the channel forming substance of the FT structure and the ratio of introduction are differentiated as the gate is formed after forming the source/drain regions in the process of manufacturing an electronic element.

For the fourth example of electronic element, an element separating region for separating the pMIS transistor forming region and the nMIS transistor forming region in a silicon substrate (FIG. 10B) as in the case of the first example of electronic element.

Then, a dummy gate insulating film is formed on the silicon substrate typically as a 20 nm-thick silicon oxide film. Subsequently, a dummy gate electrode film is formed typically as an 80 nm-thick polycrystalline silicon film by means of a CVD system.

Thereafter, a resist mask is formed on the dummy gate electrode film to produce dummy gate electrodes by means of an application process and photolithography. A dummy gate electrode for a pMIS transistor and a dummy gate electrode for an nMIS transistor are formed by etching, using the resist mask. Then, the resist mask is removed by ashing.

Subsequently, a resist mask that covers the nMIS transistor forming region and has an opening on the pMIS transistor forming region is formed. Then, a P type impurity (e.g., B) is introduced into an upper layer of the N-well region, using the resist mask and the dummy gate electrode as a mask. As a result, a low concentration diffusion layer is formed for the pMIS transistor. Thereafter, the resist mask is removed.

Similarly, a resist mask that covers the pMIS transistor forming region and has an opening on the nMIS transistor forming region is formed. Then, an N type impurity (e.g., P) is introduced into an upper layer of the P-well region, using the resist mask and the dummy gate electrode as a mask. As a result, a low concentration diffusion layer is formed for the nMIS transistor. Thereafter, the resist mask is removed.

Then, the substrate is subjected to a heat treatment. The heat treatment is conducted in a nitrogen atmosphere at a treatment temperature of 1050° C. for a treatment time of 30 seconds. Note, however, the treatment time will be determined appropriately depending on the selected heat treatment process such as spike annealing, laser annealing, lamp annealing or the like. As a result of the heat treatment, the impurities in the low concentration diffusion layers of the source/drain regions, the P-well region and the N-well region are activated.

Then, after forming an insulation film on the entire surface of the substrate, side walls are formed on the lateral walls of the dummy gate electrodes by etching the insulation film. The insulation film is typically made of silicon nitride that is produced by means of a CVD system.

Additionally, a resist mask that covers the nMIS transistor forming region and has an opening on the pMIS transistor forming region is formed. Then, a P-type impurity (e.g., boron or boron difluoride) is introduced into an upper layer of the N-well region, using the resist mask, the dummy gate electrode and the side wall as a mask. As a result of the introduction, a source/drain region diffusion layer of the pMIS transistor is formed in the N-well regions at the opposite sides of the dummy gate electrode by way of the low concentration diffusion layer. Thereafter, the resist mask is removed.

Similarly, a resist mask that covers the pMIS transistor forming region and has an opening on the nMIS transistor forming region is formed. Then, an N-type impurity (e.g., phosphor or arsenic) is introduced into an upper layer of the P-well region, using the resist mask, the dummy gate electrode and the side wall as a mask. As a result of the introduction, a source/drain region diffusion layer of the nMIS transistor is formed in the P-well regions at the opposite sides of the dummy gate electrode by way of the low concentration diffusion layer. Thereafter, the resist mask is removed.

Then, an interlayer insulation layer is formed to cover the dummy gate electrodes typically as a silicon oxide film by means of a CVD system. The interlayer insulation film is formed to show a height that is at least higher than the dummy gate electrodes.

Then, the surface of the interlayer insulation film is planarized by CMP and the top surfaces of the dummy gate electrodes are exposed. Gate grooves are formed by removing the dummy gate electrodes and the dummy gate insulating films under the dummy gate electrodes by etching. Then, phosphor (P) and fluorine (F) are implanted to the surface of the silicon substrate at the openings by ion implantation at a low rate. At this time, silicon is implanted by ion implantation to a small extent in advance to turn the surface and its vicinity to amorphous in order to prevent channeling from taking place so as to prevent P ions and F ions from entering too deep into the substrate. In an experiment, a PF doped layer (FT structure semiconductor channel) is prepared to a concentration that is as high as $2 \times 10^{22}$ cm$^{-3}$.

Additionally, the nMIS transistor forming region is covered by resist and a PCl doped layer (FT structure semiconductor channel) is formed only in the pMIS transistor forming region to a high concentration of $1 \times 10^{22}$ cm$^{-3}$. Thus, the P orbital energy is raised remarkably by introducing chlorine (Cl) into interstitial regions to a greater extent. Then, as a result, the apex of the valence electron band is sharpened.

In the embodiment, the dummy gate part (electrode and insulation film) of the nMIS transistor forming region and that of the pMIS transistor forming region are removed simultaneously to form an FT structure channel. Then, the dummy gate part of the pMIS transistor forming region is doped additionally. It is also possible to form an FT structure at one of them at a time. It is also possible to optimize the mobility by differentiating the doping ratio and the doping substance.

Subsequently, a very thin FT structure film is formed on and near the surface by annealing at 650° C. for 3 minutes in an Ar gas atmosphere. It is possible to add B to the nMIS transistor forming region and P to the pMIS transistor forming region for the channel parts.

Thus, it is possible to further uniformize the distribution. The channel parts can be formed by ion implantation, using a mask having apertures on the respective regions. Thereafter, an activation annealing process is conducted at a treatment temperature of 1050° C. for a treatment time of 30 seconds. The additional ion implantation of the channel parts may be omitted. If it is omitted, the doping ratio needs to be controlled when forming wells.

A SiO$_2$ film is deposited to a thickness of 4 nm as gate insulating film on the inner surface of the gate grooves by means of a CVD system. A silicon oxide film, an acid nitride film or a highly dielectric insulation film may be used for the gate insulating film. More specifically, a nitride film of the acid/nitrogen type that contains nitride, a highly dielectric film such as HfO$_2$, HfSiON or LaAlO$_3$ or a multilayer film of such compounds may selectively be used according to the application.

At this time, a gate insulating film is formed also on the interlayer insulation film. Thereafter, a 5 nm-thick titanium nitride (TiN) film and a 100 nm-thick tungsten (W) film are formed for the gate electrodes to bury the gate grooves by means of a CVD system.

Then, the gate electrode film and the gate insulating film formed on the interlayer insulation film are removed by CMP for planarization. Each of the nMIS transistor forming region and the pMIS transistor forming region is covered by resist film and phosphor (P) or boron (B) is introduced. As a result of this introduction, the work function of each of the gate electrodes is adjusted and the gate electrodes are completed.

Each of the gate electrodes may be a silicide film of titanium silicide, cobalt silicide, nickel silicide, tantalum silicide or the like, a metal film, a polysilicon film or a multilayer film of more than one of them. The work function of the gate electrode can be adjusted by introducing a dopant that is suitable for the material of the electrode by thermal diffusion or ion implantation from the multilayer film.

A dopant may be introduced to adjust the work function of only one of the gate electrodes. If such is the case, it is only necessary to form a resist mask for the gate electrode so that the manufacturing process can be simplified. Of course, an appropriate metal film, a silicide film, a polysilicon film or a multilayer film of any of such films may be formed on one of them at a time.

A heat treatment is conducted subsequently. More specifically, the heat treatment is conducted at a treatment temperature of 550° C. for a treatment time of 3 minutes in a nitrogen atmosphere. The heat treatment time may be appropriately selected according to the selected known heat treatment process such as spike annealing, laser annealing, lamp annealing or the like.

Thus, gate electrodes are formed in the respective gate grooves by way of a gate insulating film to complete the process of producing an nMIS transistor and a pMIS transistor. In an experiment, an electronic element having an nMIS transistor and a pMIS transistor in silicon channels was formed on an ordinary silicon substrate that is not an FT structure substrate by completely following the above-described manufacturing process.

Firstly, the difference of mobility was compared. An electronic element according to the present invention showed a mobility improvement of 3 times in terms of peak mobility and that of not less than 2.5 times over the entire high electric field region that is influential to the drive performance in actual operations can be achieved at the nMIS side. Similarly, an improvement of 2.8 times in terms of peak mobility and that of not less than 2.2 times over the entire high electric field region can be achieved at the pMIS side. Slightly higher values are observed at the pMIS side if compared with the first example of electronic element due to the devices made for the doping ratio and the dopant for the FT channel.

Then, a large number of MIS structures were prepared and the statistic distribution of threshold value Vth was compared between Si substrates according to the present invention and conventional Si substrates. The dispersion of threshold value Vth was about $3\sigma=50$ mV for both nMIS and pMIS when an ordinary Si channel was used. On the other hand, the dispersion of Vth was about $3\sigma=6$ mV, when an FT structure channel of the embodiment was used. It is possible to automatically adjust the uniformity and the periodicity of the impurities by utilizing strain as a characteristic of an FT structure channel. For this reason, the dispersion of the threshold value is suppressed to a negligible level if compared with conventional channels.

As modifications to the above-described manufacturing process, nMIS transistors and pMIS transistors were prepared with various different substances for forming the FT structure channels and different doping ratios. The materials are described above in detail. Transistors were formed to confirm that a high mobility level can be achieved by any of such modified manufacturing processes. It is also possible to prepare transistors by using an SOI substrate as described above by referring to FIGS. 11A and 11B. The use of an SOI substrate is effective for suppressing the short channel effect.

The substances, the film forming process, the film thickness and the substances used for forming a channel having a pendant FT structure, SD regions, a gate insulating film and so on as well as the substances, the method of introducing the substances and the introducing ratio that are employed for the purpose of conversions of electrodes for nMIS and pMIS (B and P are used in the embodiment), the structure of the transistors and the method of preparing them as described above for each of the examples of electronic element are only examples and may be modified appropriately without departing from the scope of the present invention.

Thus, according to the present invention, it is possible to provide a semiconductor channel material showing a mobility level that cannot achieved by any conventional methods and an electronic element using such a semiconductor channel material by using a semiconductor having a tetrahedral structure as host material, substituting a component substance and introducing a substance into interstitial positions. Additionally, it is possible to provide a MIS-type transistor that shows a high mobility level and little fluctuations of threshold value from element to element by using an electronic element according to the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents. The following summaries are included in each embodiment form mentioned above.

(1). A method of manufacturing an electronic device comprising:
   forming an element isolating region for separating a pMIS transistor forming region and an nMIS transistor forming region on a silicon substrate;
   forming a P-well region and an N-well region by diffusing impurities;
   forming a side wall operating as gate electrode lateral wall in the gate forming region in each of the P-well region and the N-well region;
   forming source/drain regions in the P-well region and in the N-well region in a self-aligning manner;
   conducting a heat treatment on the channel part of the gate forming region, introducing phosphor and fluorine by ion implantation, to form a channel layer having an active layer of a filled tetrahedral structure;
   forming a gate insulating film so as to cover the channel layer; and
   forming a gate electrode of a conductor on the gate insulating film.

(2). The method according to (1), wherein
   the silicon substrate is made to have an SOI substrate structure by forming an insulation film on the silicon substrate and then forming a silicon film by epitaxial growth; and
   the channel layer having an active layer of a filled tetrahedral structure is formed in the silicon film.

(3). A method of manufacturing an electronic device comprising:
   forming an FT structure substrate having a filled tetrahedral structure film by heat treating a silicon substrate, introducing phosphor (P) and fluorine (F) to the entire area of one of the surfaces of a silicon substrate by ion implantation;
   forming an element isolation region for applying strain to a channel layer by separating a pMIS transistor forming region and an nMIS transistor forming region in the filled tetrahedral structure substrate;
   forming a P well and an N well respectively in the nMIS transistor forming region and in the pMIS transistor forming region;
   forming a gate insulating film of a silicon oxide film on the filled tetrahedral structure film of the P well and the N well;
   forming a gate electrode section to be turned to the n-type of the nMIS region and a gate electrode section to be turned to the p-type of the pMIS region, the gate electrodes being made of polysilicon and formed on the gate insulating film; and
   forming a side wall on the lateral wall the gate electrode and forming source/drain regions after forming the side wall.

(4). The method according to (3), wherein
   the FT structure substrate is prepared by
   forming a filled tetrahedral structure film by implantation ions of P and F simultaneously to the entire area of one of the surfaces of the silicon substrate and conducting a heat treatment;
   cementing a supporting silicon substrate to be cemented to the filled tetrahedral structure film, implanting hydrogen ions (H) to and near the interface of the FT structure film/substrate at the side of the silicon substrate and conducting a heat treatment; and
   scraping off the part of the filled tetrahedral structure film damaged by ions by means of CMP (chemical mechanical polishing) and a hydrofluoric acid process after the heat treatment.

(5). The method according to (4), wherein
   the supporting silicon substrate to be cemented is provided with an oxide film formed on the entire area of one of the surfaces thereof and the oxide film is cemented to the filled tetrahedral structure film.

What is claimed is:
1. A semiconductor device having a MIS-type field effect transistor comprising:
   a first semiconductor film;
   source/drain regions formed so as to be separated from each other by the first semiconductor film;
   a gate insulating film formed on the first semiconductor film between the source/drain regions; and
   a gate electrode formed on the gate insulating film,
   the first semiconductor film including:
   a host semiconductor having component atoms so bonded as to form a tetrahedral bonding structure;

impurity atoms S for substituting the component atoms of sites of lattice points of the host semiconductor and the impurity atoms S being made to have a valance electron agreeing with that of the component atoms of the host semiconductor; and impurity atoms I to be inserted into interstitial sites of the host semiconductor, the impurity atoms I being bonded to the impurity atoms S and the impurity atoms I being in a state of showing an electronic arrangement of a closed shell structure.

2. The device according to claim 1, wherein
the first semiconductor film includes the impurity atoms S and the impurity atoms I introduced into it by not less than $4\times10^{20}$ cm$^{-3}$ for each.

3. The device according to claim 1, wherein
the bond of component atoms of the first semiconductor film extends in the bonding direction of the tetrahedral bonding structure.

4. The device according to claim 1, wherein
the bond of component atoms of the first semiconductor film extends in the <111> direction.

5. The device according to claim 1, further comprising:
a second semiconductor film different from the first semiconductor film in terms of thermal expansion coefficient or lattice constant, the second semiconductor film being arranged on a same plane with the first semiconductor film; and the bond of component atoms of the first semiconductor film is extended in a specific bonding direction due to the strain applied from the second semiconductor film.

6. The device according to claim 1, wherein
a second semiconductor film different from the first semiconductor film in terms of thermal expansion coefficient or lattice constant is laid on the first semiconductor film; and the bond of component atoms of the first semiconductor film is extended in a specific bonding direction due to the strain applied from the second semiconductor film.

7. The device according to claim 1, wherein
the host semiconductor material is at least a material selected from silicon (Si), germanium (Ge), carbon (C) and gallium arsenic (GaAs).

8. The device according to claim 1, further comprising a semiconductor substrate and the first semiconductor film is formed on the semiconductor substrate.

9. The device according to claim 1, further comprising a semiconductor substrate and an insulation film formed on the semiconductor substrate, and the first semiconductor film is formed on the insulation film.

* * * * *